(12) United States Patent
Kano et al.

(10) Patent No.: US 8,293,846 B2
(45) Date of Patent: Oct. 23, 2012

(54) COMPOSITION FOR FORMING LAYER TO BE PLATED, METHOD OF PRODUCING METAL PATTERN MATERIAL, METAL PATTERN MATERIAL

(75) Inventors: Takeyoshi Kano, Kanagawa (JP); Masataka Sato, Kanagawa (JP); Takatsugu Kawano, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 605 days.

(21) Appl. No.: 12/506,262

(22) Filed: Jul. 21, 2009

(65) Prior Publication Data

US 2010/0080964 A1 Apr. 1, 2010

(30) Foreign Application Priority Data

Sep. 26, 2008 (JP) .................................. 2008-249210
Jan. 27, 2009 (JP) .................................. 2009-015465
Mar. 26, 2009 (JP) .................................. 2009-077026

(51) Int. Cl.
*B32B 27/08* (2006.01)
*C08F 22/30* (2006.01)
*C08K 5/07* (2006.01)

(52) U.S. Cl. ...................... 525/330.3; 525/217; 525/218; 525/221; 525/231; 205/125; 427/558; 428/195.1

(58) Field of Classification Search .................. 526/297, 526/317.1; 525/330.3, 217, 218, 221, 231; 205/125; 427/558; 428/195.1
See application file for complete search history.

(56) References Cited

U.S. PATENT DOCUMENTS

2009/0214876 A1* 8/2009 Kano et al. .................. 428/423.1

FOREIGN PATENT DOCUMENTS

WO 2008/050715 A1 5/2008
WO WO 2008/050715 * 5/2008

OTHER PUBLICATIONS

Advanced Materials (2000) vol. 20, pp. 1481-1494.

* cited by examiner

*Primary Examiner* — Ling Choi
*Assistant Examiner* — Chun-Cheng Wang
(74) *Attorney, Agent, or Firm* — SOLARIS Intellectual Property Group, PLLC

(57) ABSTRACT

A composition including a polymer, the polymer having a non-dissociative functional group that interacts with a plating catalyst or a precursor thereof, a radical polymerizable group, and an ionic polar group; a method of producing a metal pattern material using the same: and a metal pattern material produced by the method.

18 Claims, No Drawings

COMPOSITION FOR FORMING LAYER TO BE PLATED, METHOD OF PRODUCING METAL PATTERN MATERIAL, METAL PATTERN MATERIAL

CROSS-REFERENCE TO RELATED APPLICATION

This application claims priority under 35 USC 119 from Japanese Patent Application Nos. 2008-249210 filed Sep. 26, 2008, 2009-015465 filed Jan. 27, 2009 and 2009-077026 filed Mar. 26, 2009, the disclosures of which are incorporated by reference herein.

BACKGROUND OF THE INVENTION

1. Field of the Invention

The present invention relates to a composition for forming a layer to be plated, a method of producing a metal pattern material, and a metal pattern material.

2. Description of the Related Art

Conventionally, a metal wiring board having a wiring formed from a metal pattern on a substrate made of an insulating material has been widely used in electronic devices or semiconductor devices.

Such a metal pattern material is produced typically by a subtractive method. This method includes forming, on a metal film formed on a substrate, a photosensitive layer that is sensitized by irradiating with actinic light, exposing the photosensitive layer with light in an imagewise manner, developing the same to form a resist image, forming a metal pattern by etching the metal film, and then peeling off the resist image.

In the subtractive method, the surface of the substrate is roughened so that the metal film can be tightly adhered thereto by means of an anchoring effect. Therefore, there has been a problem in that degradation in high-frequency characteristics may occur when the metal pattern material is used for metal wiring. Further, there has been a problem in that since the surface of the substrate needs to be treated with a strong acid such as chromium acid for roughening, a complicated process is required in order to obtain a metal pattern that exhibits excellent adhesiveness between the metal film and the substrate.

In order to solve the above problem, Advanced Materials (2000) Vol. 20, pp. 1481-1494 proposes a method of improving the adhesiveness between the substrate and the metal film without performing surface roughening, the method including subjecting the substrate surface to a plasma treatment and introducing a polymerization initiating group thereto, and then generating a graft polymer having a polar group on the surface of the substrate by polymerizing a monomer from the polymerization initiating group.

Further, International Publication No. WO08/050715 discloses a method of obtaining a metal pattern (plating film) that exhibits excellent adhesiveness with respect to a substrate, the method including forming a polymer layer on the substrate by generating a graft polymer that bonds to the substrate, performing plating with respect to the polymer layer, and then etching the obtained plating film.

However, the above method utilizes, as a compound that forms a graft polymer, a polymer having a polymerizable group and a non-dissociative functional group that interacts with a plating catalyst or a precursor thereof. Since this polymer has low affinity to an aqueous solution, highly alkali water needs to be used for developing a portion of the polymer layer formed on the substrate, thereby taking a long time for the development process.

The present invention has been made in view of the aforementioned circumstances, and aims to provide a composition that forms a layer to be plated, which layer can be developed with an aqueous solution and has an excellent adsorption property with respect to a plating catalyst or a precursor thereof. Further, the present invention aims to provide a method of producing a metal pattern material in which a metal pattern having excellent adhesiveness with respect to a substrate can be readily formed by performing development with an aqueous solution.

SUMMARY OF THE INVENTION

A first aspect of the invention provides a composition comprising a polymer, the polymer having a non-dissociative functional group that interacts with a plating catalyst or a precursor thereof, a radical polymerizable group, and an ionic polar group.

A second aspect of the invention provides a method of forming a metal pattern material, the method comprising:

(1) contacting a composition to a substrate and applying energy to cure the composition at a portion to which the energy has been applied, the composition comprising a polymer having a non-dissociative functional group that interacts with a plating catalyst or a precursor thereof, a radical polymerizable group, and an ionic polar group;

(2) forming a patterned layer by developing an uncured portion of the composition with an aqueous solution;

(3) applying the plating catalyst or the precursor thereof to the patterned layer; and (4) performing plating with respect to the plating catalyst or the precursor thereof.

DETAILED DESCRIPTION OF THE INVENTION

The composition for forming a layer to be plated according to the invention contains a polymer that has a non-dissociative functional group that interacts with a plating catalyst or a precursor thereof, a radical polymerizable group, and an ionic polar group. In the following, this polymer is referred to as "specific polymer" sometimes.

<Specific Polymer>

The specific polymer according to the invention has, in its molecule, a non-dissociative functional group that interacts with a plating catalyst or a precursor thereof (hereinafter, referred to as "interactive group" sometimes), a radical polymerizable group, and an ionic polar group.

Examples of the interactive group include a non-dissociative functional group such as a group capable of multidentate coordination, a nitrogen-containing functional group, a sulfur-containing functional group, and an oxygen-containing functional group (i.e., a functional group that does not generate protons by dissociation).

The non-dissociative functional group is preferably a functional group capable of coordinating with a metal ion, a nitrogen-containing functional group, a sulfur-containing functional group, an oxygen-containing functional group, or the like. Specific examples thereof include nitrogen-containing functional groups such as an imide group, a pyridine group, a tertiary amino group, an ammonium group, a pyrrolidone group, an amidino group, a triazine group, a triazole group, a benzotriazol group, a benzoimidazole group, a quinoline group, a pyrimidine group, a pyrazine group, a quinazoline group, a quinoxaline group, a purine group, a triazine group, a piperidine group, a piperazine group, a pyrrolidine group, a pyrazole group, an aniline group, a group having an alkylamine group structure, a group having an isocyanuric structure, a nitro group, a nitroso group, an azo group, a diazo group, an azide group, a cyano group and a cyanate (R—O—CN) group; oxygen-containing functional groups such as a hydroxyl group, a carbonate group, an ether group, a carbonyl group, an ester group, a group having an N-oxide structure, a group having an S-oxide structure and a group having an N-hydroxy structure; sulfur-containing functional groups such as a thiophene group, a thiol group, a thiocyanuric acid group, a benzothiazole group, a mercaptotriazine group, a thioether group, a thioxy group, a sulfoxide group, a sulfonic group, a sulfite group, a group having a sulfoximine structure, a group having a sulfoxonium salt structure, and a group having a sulfonic acid ester structure; phosphorus-containing functional groups such as a phosphate group, a phosphoramide group and a phosphine group; groups containing a halogen atom such as chlorine or bromine; and groups containing an unsaturated ethylenic bond. An imidazole group, a urea group or a thiourea group are also applicable if the group acts as a non-dissociative functional group with respect to an adjacent atom or atomic group. Further, a functional group derived from a compound capable of forming a clathrate such as cyclodextrin or crown ether may be used.

Among them, an ether group (more specifically, a group having a structure represented by —O—(CH$_2$)n-O—, where n is an integer of from 1 to 5) or a cyano group is particularly preferred from the viewpoint of high polarity and high adsorption capacity to a plating catalyst or the like, and a cyano group is most preferred.

In general, the higher the polarity is, the higher the water absorption rate tends to be. However, since cyano groups interact with each other so as to cancel the polarity thereof in the layer to be plated, the layer becomes dense and the polarity of the layer as a whole decreases. Therefore, the water absorbancy of the layer can be reduced in spite of its high polarity. Further, when the catalyst is adsorbed to the layer to be plated using a good solvent for the layer, the cyano groups are solvated to cancel the interaction between them, which enables the cyano groups to interact with the plating catalyst. For the above reasons, the layer to be plated preferably contains a cyano group in order to achieve the properties that contradict each other, i.e., low water absorbency and high interaction property with a plating catalyst.

The interactive group according to the invention is more preferably an alkylcyano group. This is because when the cyano group is bonded to an aromatic ring, electrons are attracted to the aromatic ring to lower the donating property of unpaired electrons that play an important role as the adsorption property to a plating catalyst or the like. Therefore, an alkylcyano group, which is not bonded to an aromatic ring, is preferable in view of the adsorption property to a plating catalyst or the like.

The interactive group may be introduced into the specific polymer by copolymerizing a monomer including a pendant interactive group, adding the monomer to a portion of a polymer that has been previously synthesized (for example, a polymer having an ionic polar group and a radical polymerizable group), or substituting a portion of the polymer with the monomer.

The radical polymerizable group is not particularly limited as long as it is a functional group capable of polymerization directly by applying energy, or by means of a radical that is generated from a co-existing radical generating agent. Specific examples thereof include an acryloyl group, a methacryloyl group, an acrylamide group, a methacrylamide group, an allyl group, a vinyl group, and a styryl group. Among these, an acryloyl group, a methacryloyl group, an acrylamide group and a methacrylamide group are preferred from the viewpoint of radical polymerization reactivity and synthesis versatility.

The radical polymerization group may be introduced into the specific polymer by copolymerizing a monomer including a pendant radical polymerizable group, adding the monomer to a portion of a polymer that has been previously synthesized (for example, a polymer having an ionic polar group and an interactive group), or substituting a portion of the polymer with the monomer.

The ionic polar group in the specific polymer is not particularly limited as long as it can provide the specific polymer with developability to an aqueous solution. Specific examples thereof include a carboxyl group, a sulfonic group, a phosphoric group or a boronic group. Among these, a carboxyl group is preferred because of its moderate acidity (by which other functional groups do not decompose). In particular, in order to further achieve low water absorbency that is necessary for electric wiring, a carboxyl group that is directly bound to an alicyclic structure (alicyclic carboxyl group) and a carboxyl group that is positioned separately from the polymer chain (long-chain carboxyl group) are preferred.

The ionic polar group may be introduced into the specific polymer by copolymerizing a monomer including a pendant ionic polar group, adding the monomer to a portion of a polymer that has been previously synthesized (for example, a polymer having an interactive group and a radical polymerizable group), or substituting a portion of the polymer with the monomer.

The specific polymer according to the invention is preferably a copolymer including a unit represented by the following formula (A), a unit represented by the following formula (B), and a unit represented by the following formula (C).

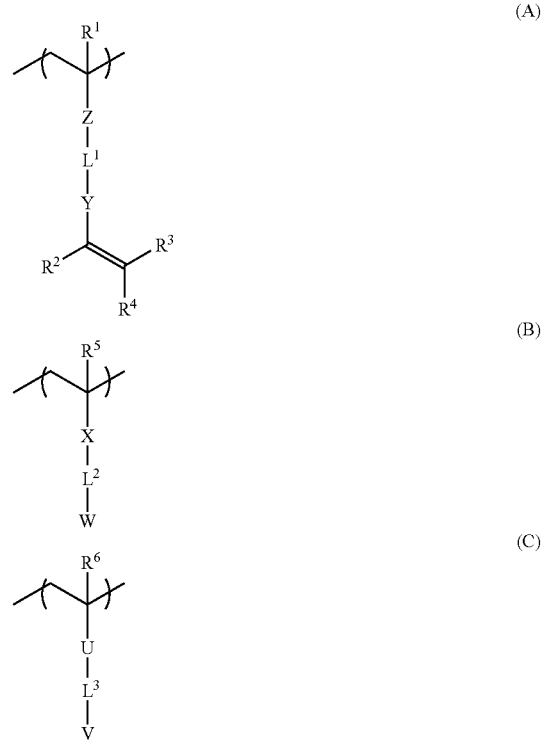

In formulae (A) to (C), $R^1$ to $R^6$ each independently represent a hydrogen atom or an alkyl group that may be substituted or unsubstituted; X, Y, Z and U each independently represent a single bond, a divalent organic group that may be substituted or unsubstituted, an ester group, an amide group or an ether group; $L^1$, $L^2$ and $L^3$ each independently represent a single bond or a divalent organic group that may be substituted or unsubstituted; W represents a non-dissociative functional group that interacts with a plating catalyst or a precursor thereof, and V represents an ionic polar group.

When $R^1$ to $R^6$ are an alkyl group that may be substituted or unsubstituted, examples of the alkyl group that is not substituted include a methyl group, an ethyl group, a propyl group and a butyl group. Examples of the alkyl group that is substituted include a methyl group, an ethyl group, a propyl group and a butyl group that are substituted by a methoxy group, a hydroxyl group, a chlorine atom, a bromine atom, a fluorine atom or the like.

$R^1$ is preferably a hydrogen atom, a methyl group or a methyl group that is substituted by a hydroxyl group or a bromine atom.

$R^2$ is preferably a hydrogen atom, a methyl group or a methyl group that is substituted by a hydroxyl group or a bromine atom.

$R^3$ is preferably a hydrogen atom.

$R^4$ is preferably a hydrogen atom.

$R^5$ is preferably a hydrogen atom, a methyl group or a methyl group that is substituted by a hydroxyl group or a bromine atom.

$R^6$ is preferably a hydrogen atom, a methyl group or a methyl group that is substituted by a hydroxyl group or a bromine atom.

Further, in view of the flexibility of the specific polymer, it is preferable that all of $R^1$, $R^5$ and $R^6$ be a hydrogen atom.

When X, Y, Z and U are a divalent organic group that may be substituted or unsubstituted, examples thereof include an aliphatic hydrocarbon group that may be substituted or unsubstituted, and an aromatic hydrocarbon group that may be substituted or unsubstituted.

X, Y, Z and U are preferably a single bond, an ester group, an amide group or an ether group, more preferably a single bond, an ester group or an amide group, and yet more preferably a single bond or an ester group.

Further, in one preferred embodiment, each of $L^1$, $L^2$ and $L^3$ is a linear, branched or cyclic alkylene group, an aromatic group, or a combination of these groups. The combination of an alkylene group and an aromatic group may include an ether group, an ester group, an amide group, a urethane group or a urea group in between. In particular, $L^1$, $L^2$ and $L^3$ preferably include the total number of carbon atoms of 1 to 15, and are preferably unsubstituted. The total number of carbon atoms here refers to the total number of carbon atoms included in the divalent organic group that may be substituted or unsubstituted represented by $L^1$. The same also applies to $L^2$ and $L^3$, respectively.

Specific examples of the divalent organic group include a methylene group, an ethylene group, a propylene group, a butylene group, a phenylene group, these groups substituted by a methoxy group, a hydroxy group, a chlorine atom, a bromine atom, a fluorine atom or the like, and a combination of these groups.

In particular, in the unit represented by formula (C), V is preferably a carboxyl group and $L^3$ preferably includes a four to eight-membered cyclic structure at a position at which $L^3$ is connected to V. In this case, the unit can be moderately acidic (by which other functional groups do not decompose), and tends to exhibit hydrophilic properties in an alkali aqueous solution while exhibiting hydrophobic properties after being dried, due to its cyclic structure.

Examples of the four to eight-membered cyclic structure include a cyclobutyl group, a cyclopentyl group, a cyclohexyl group, a cycloheptyl group, a cyclooctyl group and a phenyl group. Among these, a cyclohexyl group and a phenyl group are preferred. Namely, in this embodiment, an alicyclic carboxyl group is positioned at the terminal end of the unit represented by formula (C).

Further, in the unit represented by formula (C), V is preferably a carboxyl group and $L^3$ preferably has a chain length of 6 to 18 atoms. In this case, the unit can be moderately acidic (by which other functional groups do not decompose), and tends to exhibit hydrophilic properties in an alkali aqueous solution while exhibiting hydrophobic properties after being dried, due to its long-chain alkyl group structure. The chain length of $L^3$ here refers to a distance between U and V in formula (C). It is preferable that $L^3$ include 6 to 18 atoms between U and V, more preferably 6 to 14 atoms, yet more preferably 6 to 12 atoms.

In another preferred embodiment, V is a carboxyl group and U and $L^3$ are a single bond, respectively. In this case, adhesiveness between the substrate and the metal pattern immediately after the formation of the metal pattern can be improved, and moisture fastness of the layer to be plated can be improved.

In the unit represented by formula (B), W represents a non-dissociative functional group that interacts with a plating catalyst or a precursor thereof. Examples of the non-dissociative functional group include those as mentioned above. In particular, W is preferably a cyano group or an ether group due to its high polarity and high adsorption property with respect to a plating catalyst or the like.

In the unit represented by formula (C), V represents an ionic polar group, and examples thereof include those as mentioned above. In particular, as discussed above, V is preferably a carboxyl group due to its moderate acidity (by which other functional groups do not decompose).

The unit represented by formula (A) is preferably included at an amount of 5 to 50 mol %, more preferably 5 to 30 mol % of the total amount of copolymerization components, from the viewpoint of reactivity (curability and polymerizability) and suppressing gelation upon synthesis.

The unit represented by formula (B) is preferably included at an amount of 5 to 80 mol %, more preferably 10 to 70 mol % of the total amount of copolymerization components, from the viewpoint of adsorption property with respect to a plating catalyst or a precursor thereof.

The unit represented by formula (C) is preferably included at an amount of 20 to 70 mol %, more preferably 20 to 60 mol % of the total amount of copolymerization components, from the viewpoint of developability and moisture-resistant adhesiveness. This content is particularly preferably 30 to 50 mol %, since both the developability and the moisture-resistant adhesiveness can be achieved more effectively.

The value of ionic polarity of the specific polymer (acid value when the ionic polar group is a carboxyl group) is preferably 1.5 to 7.0 mmol/g, more preferably 1.7 to 5.0 mmol/g, yet more preferably 1.9 to 5.0 mmol/g, particularly preferably 2.5 to 4.5 mmol/g. When the value of ionic polarity is within the above range, developability with an aqueous solution can be achieved while suppressing temporal degradation in adhesiveness under hot and humid conditions.

The optimal number of the unit and the optimal value of the ionic polarity of the specific polymer may change depending on the molecular weight of the unit having ionic polarity. In this case, priority is given to the adjustment of the ionic polarity to the above range.

The following are specific examples of the specific polymer according to the invention. However, the invention is not limited thereto. The weight average molecular weight of the examples is within a range of 3,000 to 150,000.
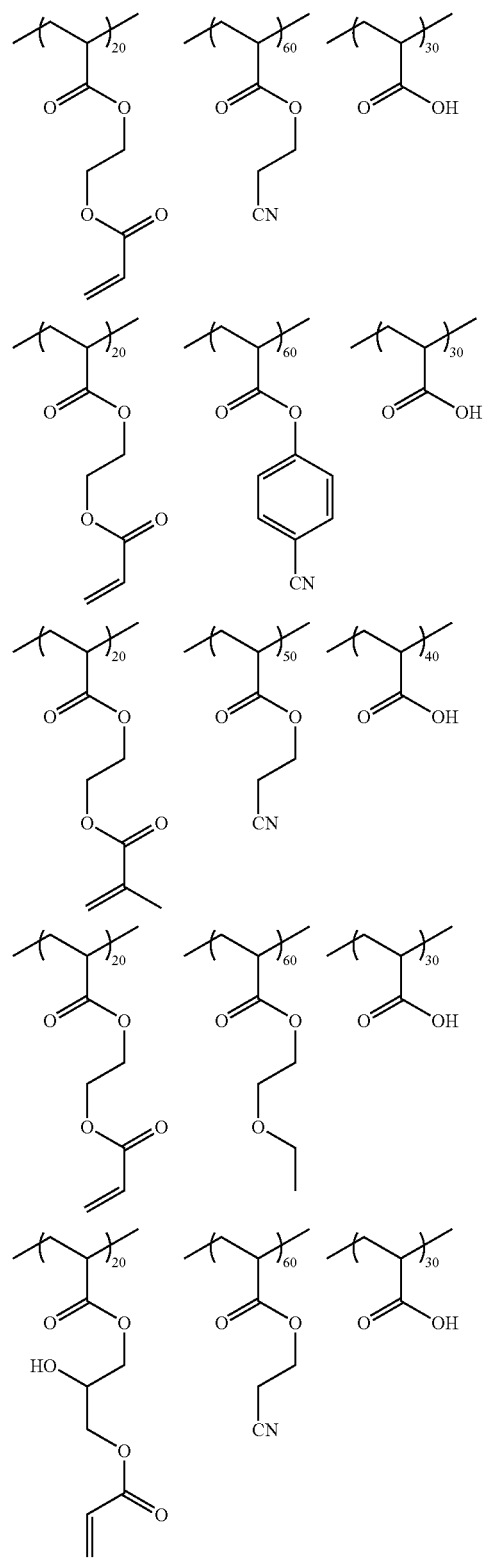

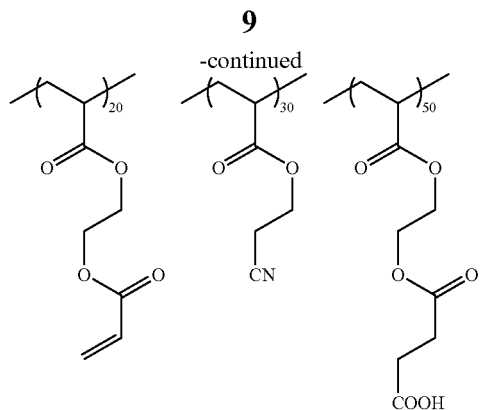
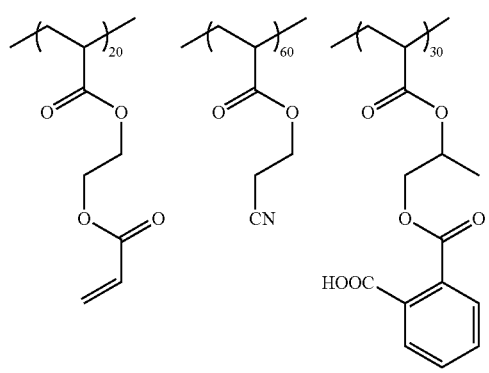
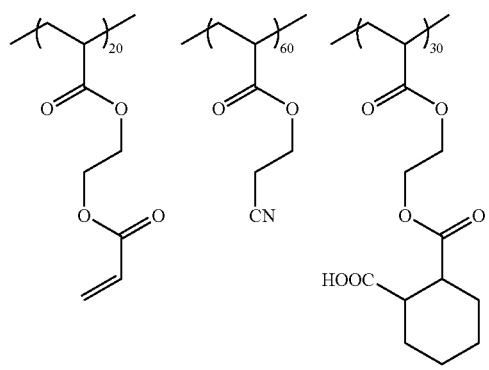
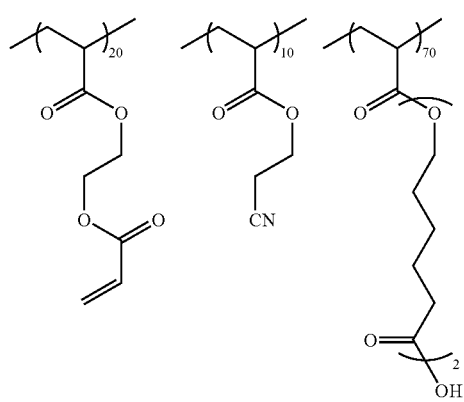
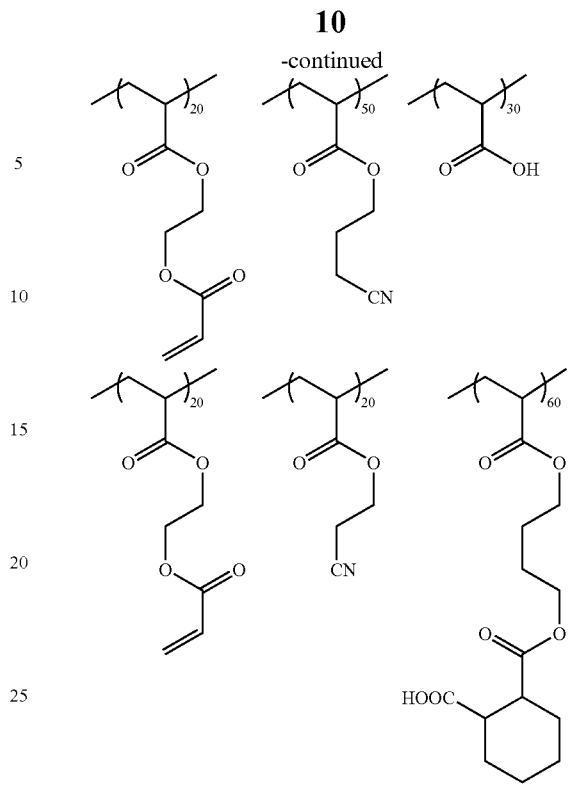

(Synthesis Method of Specific Polymer)

In the following, the synthesis method of the specific polymer according to the invention is described.

The specific polymer according to the invention is not particularly limited as long as it has the aforementioned non-dissociative interactive group, radical polymerizable group, and ionic polar group. However, the specific polymer preferably has each of these groups in a side chain thereof. The specific polymer is preferably a copolymer that includes a unit having an interactive group, a unit having a radical polymerizable group, and a unit having an ionic polar group, such as the aforementioned copolymer including the units represented by formulae (A) to (C).

The following is explanation of the specific polymer in the form of a copolymer that includes a unit having an interactive group, a unit having a radical polymerizable group, and a unit having an ionic polar group, and the synthesis method thereof.

The synthesis methods of the specific polymer in the form of a copolymer include the following processes i), ii) and iii).

i) a method of copolymerizing a monomer having a non-dissociative interactive group, a monomer having a radical polymerizable group, and a monomer having an ionic polar group.

ii) a method of copolymerizing a monomer having a non-dissociative interactive group, a monomer having a double bond precursor, and a monomer having an ionic polar group, and then introducing a double bond into the copolymer by treating the copolymer with a base or the like.

iii) a method of synthesizing a polymer having a reactive group from a monomer having a non-dissociative interactive group and a monomer having an ionic polar group, and then reacting the polymer with a monomer having a radical polymerizable group that can react with the reactive group in the polymer, thereby introducing a double bond (polymerizable group) into the polymer.

Among the above, the method ii) or iii) is preferred in view of synthesis suitability.

As mentioned above, the radical polymerizable group may be introduced into the specific polymer by copolymerizing a monomer having a pendant radical polymerizable group, adding the monomer to a portion of the previously synthesized polymer (such as a polymer having an ionic polar group and an interactive group), or substituting a portion of the previously synthesized polymer (such as a polymer having an ionic polar group and an interactive group) by the monomer.

In synthesizing the specific polymer by any of the method i), ii) or iii), a monomer of other kind may be copolymerized together in order to reduce the water absorption of the obtained specific polymer or improving the hydrophobic property of the same. Examples of such a monomer include typical radical polymerizable monomers, such as diene monomers and acrylic monomers. Among these, alkyl acrylates having no substituent, such as tertiary butyl acrylate, 2-ethylhexyl acrylate, butyl acrylate, cyclohexyl acrylate and benzyl acrylate are preferred.

The monomer having an interactive group used in the methods i), ii) and iii) is not particularly limited as long as it has a non-dissociative functional group as mentioned above, and specific examples thereof include the following. These monomers may be used alone or in combination of two or more.

Namely, examples of the monomer having a non-dissociative functional group include N-vinyl pyrolidone, N-vinyl imidazole, cyanoethyl acrylate, 1-methyl-cyanomethyl acrylate, 2-nitro-ethyl acrylate, 2-cyano-ethyl acrylamide, 1-methyl-cyanomethyl methacrylamide, 4-cyano-phenyl acrylate, N-cyanoethyl-N-ethyl-acrylamide, 3-cyano-propyl acrylate, 2-cyano-2-methyl-ethyl acrylate, 4-cyano-butyl acrylate, 5-cyano-pentyl acrylate, 6-cyano-hexyl acrylate, 1-cyanomethyl acrylate, 1-cyano-cyclohexyl acrylate, p-cyano-styrene, 4-cyano-2,2-diethyl-butyl methacrylate, and the compounds as shown below.

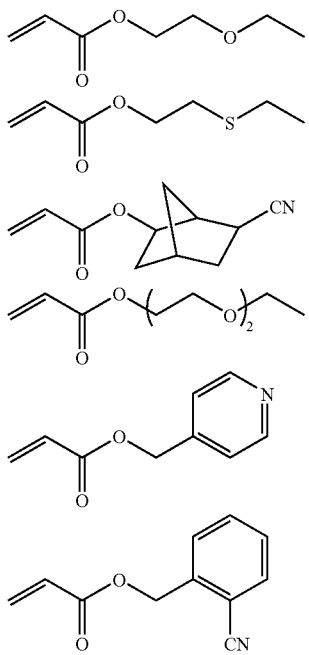

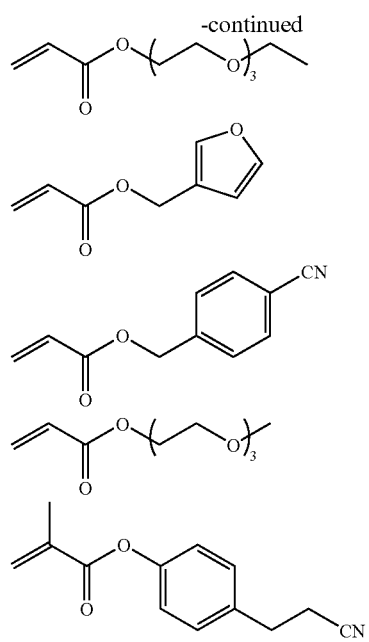

The monomer having an ionic polar group used in the methods i), ii) and iii) is not particularly limited as long as it has an ionic polar group as mentioned above, and examples thereof include a monomer having a carboxyl group, a sulfonic group, a phosphoric group or a boronic group. Specific examples thereof are described below. These monomers may be used alone or in combination of two or more.

Specific examples of the monomer having an ionic polar group include acrylic acid, fumaric acid, methacrylic acid, 4-vinyl benzoate, and the compounds as shown below.

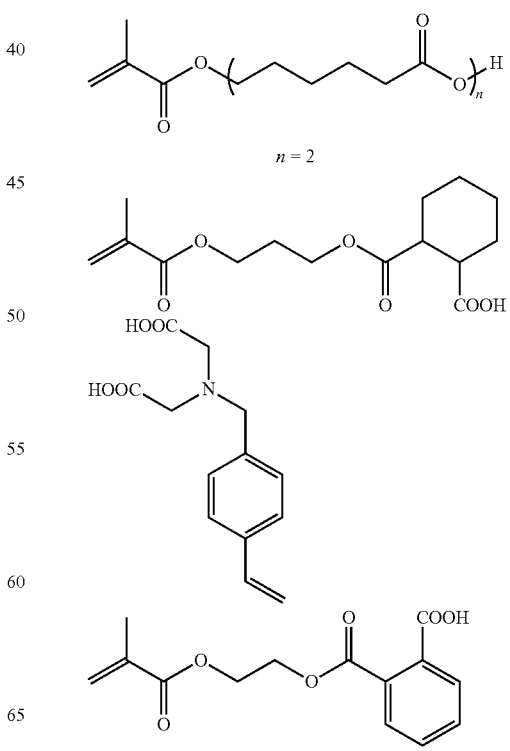

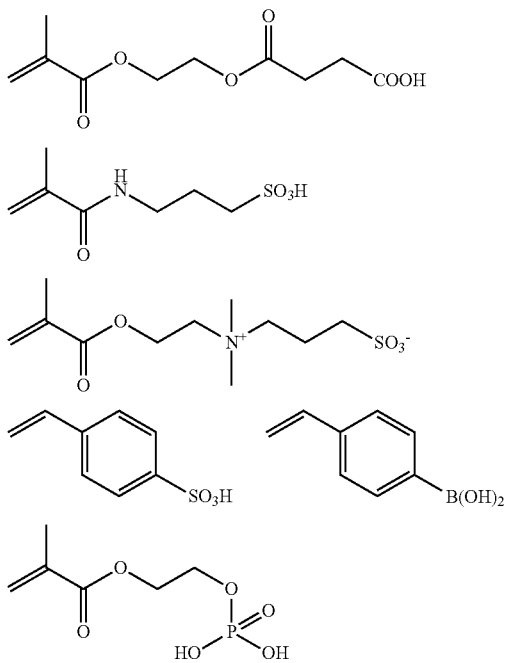

As a monomer including a carboxyl group, ARONIX M-5300, M-5400 and M-5600 (trade name, manufactured by TOAGOSEI CO., LTD.), ACRYESTER PA and HH (trade name, manufactured by MITSUBISHI RAYON CO., LTD.), LIGHT-ACRYLATE series (trade name, manufactured by KYOEISHA CHEMICAL CO., LTD.) and NK ESTER SA and A-SA (trade name, manufactured by SHIN-NAKAMURA CHEMICAL CORPORATION).

Examples of the monomer having a radical polymerizable group used in the method i) include allyl(meth)acrylate and the following compounds.

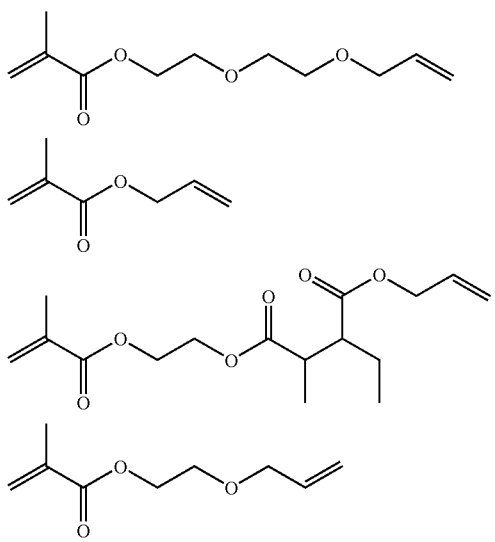

The monomer having a double bond precursor used in the method ii) include the compound represented by the following formula (a).

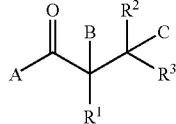

Formula (a)

In Formula (a), A represents an organic atomic group having a polymerizable group, $R^1$ to $R^3$ each independently represent a hydrogen atom or a monovalent organic group, B and C each represent a leaving group that is removed by a leaving reaction. The leaving reaction here refers to a reaction in which C is removed from the above structure by the action of a base while B leaves from the above structure. It is preferable that B leave as an anion and C leave as a cation.

Examples of the compound represented by Formula (a) include the following compounds.

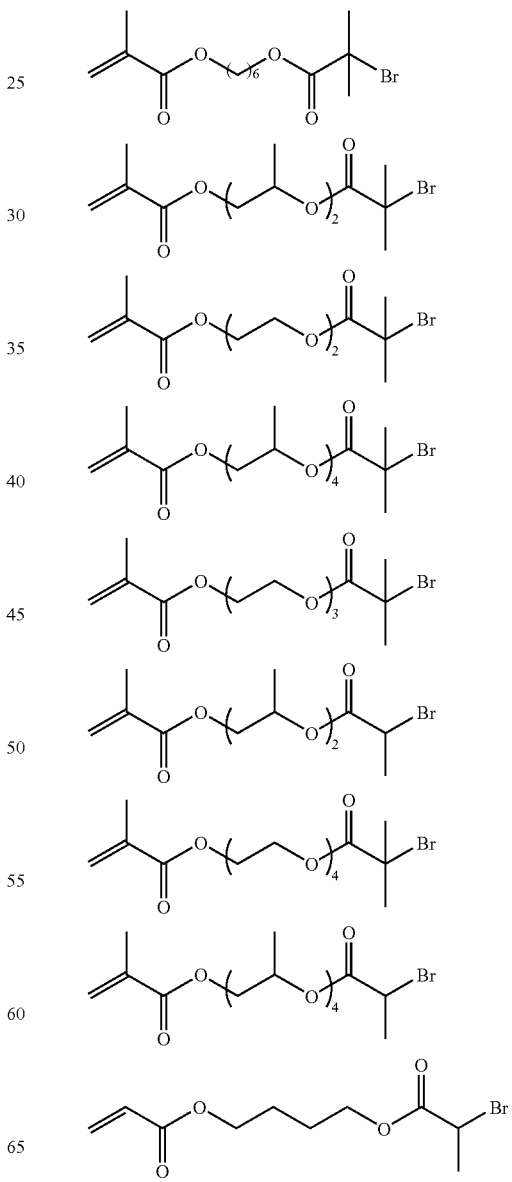

-continued

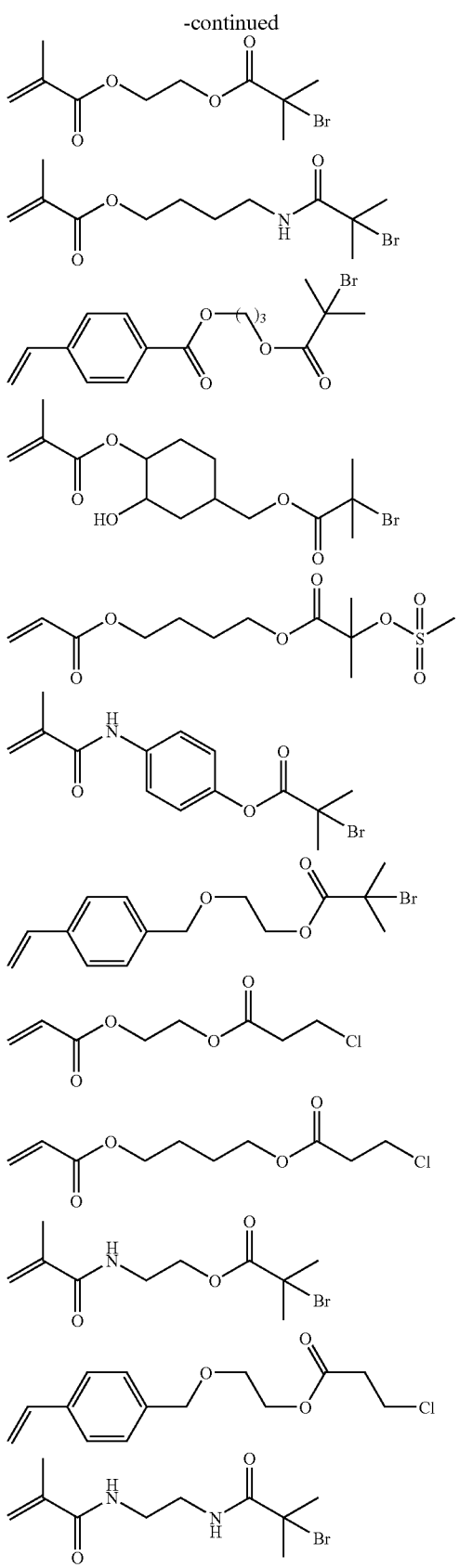

In order to convert the double bond precursor to a double bond in the method ii), the following reaction in which the leaving groups represented by B and C are removed by a leaving reaction, i.e., C is removed by the action of a base while B leaves from the structure, is used.

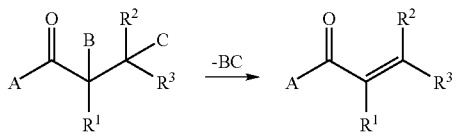

Preferable examples of the base used in the above leaving reaction include hydrides of alkali metal, hydroxides of alkali metal, carbonates of alkali metal, organic amine compounds, and metal alkoxide compounds.

Preferable examples of the hydrides of alkali metal, hydroxides of alkali metal and carbonates of alkali metal include sodium hydride, calcium hydride, potassium hydride, sodium hydroxide, potassium hydroxide, calcium hydroxide, potassium carbonate, sodium carbonate, potassium bicarbonate, and sodium bicarbonate.

Preferable examples of the organic amine compounds include trimethyl amine, triethyl amine, diethylmethyl amine, tributyl amine, triisobutyl amine, trihexyl amine, trioctyl amine, N,N-dimethyl cyclohexyl amine, N,N-diethyl cyclohexyl amine, N-methyl dicyclohexyl amine, N-ethyl dicyclohexyl amine, pyrrolidine, 1-methyl pyrrolidine, 2,5-dimethyl pyrrolidine, piperidine, 1-methyl piperidine, 2,2,6,6-tetramethyl piperidine, piperazine, 1,4-dimethyl piperazine, quinuclidine, 1,4-diazabicyclo[2.2.2]-octane, hexamethylene tetramine, morpholine, 4-methyl morpholine, pyridine, picoline(methyl pyridine), 4-dimethyl amino pyridine, lutidine(dimethyl pyridine), 1,8-diazabicyclo[5.4.0]-7-undecene (DBU), N,N'-dicylohexylcarbodiimide (DCC), diisopropylethylamine, and Schiff base.

Preferable examples of the metal alkoxide compound include sodium methoxide, sodium ethoxide, and potassium t-butoxide. These bases may be used alone or in combination of two or more.

Examples of the solvent used for the addition of a base in the aforementioned leaving reaction include ethylene dichloride, cyclohexanone, methyl ethyl ketone, acetone, methanol, ethanol, propanol, butanol, ethylene glycol monomethyl ether, ethylene glycol monethyl ether, 2-methoxy ethyl acetate, 1-methoxy-2-propanol, 1-methoxy-2-propyl acetate, N,N-dimethyl formamide, N,N-dimethyl acetoamide, dimethyl sulfoxide, toluene, ethyl acetate, methyl lactate, ethyl lactate, and water. These solvents may be used alone or in combination of two or more.

The amount of the base to be used may be less than the equivalent of the amount of specific functional groups (leaving groups represented by B and C) in the compound, or may be equal to or more than the equivalent of the amount of specific functional groups in the compound. When the base is used at an excessive amount, addition of an acid or the like in order to remove the excessive base after the leaving reaction is also preferred.

The polymer used in the method iii) can be synthesized by performing radical polymerization of a monomer having an interactive group, a monomer having an ionic polar group and a monomer having a reactive group for the introduction of a double bond. In this case, the ionic polar group and the reactive group may be the same.

Example of the monomer having a reactive group for the introduction of a double bond include monomers having, as a reactive group, a carboxyl group, a hydroxyl group, an epoxy group, an isocyanate group, or the like.

Examples of the monomer having a carboxyl group include acrylic acid, methacrylic acid, itaconic acid, vinyl benzoate, ARONIX M-5300, M-5400 and M-5600 (trade name, manufactured by TOAGOSEI CO., LTD.), ACRYESTER PA and HH (trade name, manufactured by MITSUBISHI RAYON CO., LTD.), LIGHT ACRYLATE HOA-HH (trace name, manufactured by KYOEISHA CHEMICAL CO., LTD.) and NK ESTER SA and A-SA (trade name, manufactured by SHIN-NAKAMURA CHEMICAL CORPORATION).

Examples of the monomer having a hydroxyl group include 2-hydroxyethyl(meth)acrylate, 4-hydroxybutyl(meth)acrylate, 2-hydroxypropyl(meth)acrylate, 2-hydroxybutyl(meth)acrylate, 1-(meth)acryloyl-3-hydroxy-adamantane, hydroxymethyl(meth)acrylamide, 2-(hydroxymethyl)-(meth)acrylate, 2-(hydroxymethyl)-(meth)acrylate, a methyl ester of 2-(hydroxymethyl)-(meth)acrylate, 3-chloro-2-hydroxypropyl(meth)acrylate, 3,5-dihydroxypentyl(meth)acrylate, 1-hydroxymethyl-4-(meth)acryloylmethyl-cyclohexane, 2-hydroxy-3-phenoxypropyl(meth)acrylate, 1-methyl-2-acryloyloxypropyl phthalic acid, 2-acryloyloxyethyl-2-hydroxyethyl phthalic acid, 1-methyl-2-acryloyloxyethyl-2-hydroxypropyl phthalic acid, 2-acryloyloxyethyl-2-hydroxy-3-chloropropyl phthalic acid, ARONIX M-554, M-154, M-555, M-155 and M-158 (trade name, manufactured by TOAGOSEI CO., LTD.), BLEMMER PE-200, PE-350, PP-500, PP-800, PP-1000, 70PEP-350B and 55PET800 (trade name, manufactured by NOF CORPORATION), and a lactone-modified acrylate having the following structure.

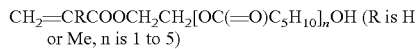
(R is H or Me, n is 1 to 5)

When a hydroxyl group-containing (meth)acrylate is used as a monomer having a hydroxyl monomer, a raw material from which a bifunctional acrylate that is generated as a by-product upon synthesis of the hydroxyl group-containing (meth)acrylate has been removed may be used, from the viewpoint of synthesizing a high-molecular polymer.

The purification of the raw material is preferably conducted by distillation or column purification, more preferably a method including the following processes (I) to (IV).

(I) dissolving in water a mixture of hydroxyl group-containing (meth)acrylate and a bifunctional acrylate that is a bi-product generated in the synthesis of the hydroxyl group-containing (meth)acrylate (II) adding a first organic solution that separates from water to the obtained aqueous solution, and then separating the phase including the first organic solvent and the bifunctional acrylate from the aqueous phase (III) dissolving, in the aqueous phase, a compound having higher water solubility than that of the hydroxyl group-containing (meth)acrylate (IV) adding a second organic solvent to the aqueous phase to extract the hydroxyl group-containing (meth)acrylate, and then condensing the same Examples of the monomer having an epoxy group include glycidyl(meth)acrylate, and CYCLOMER A and M (trade name, manufactured by DAICEL-CYTEC COMPANY LTD.)

Examples of the monomer having an isocyanate group include KARENZ AOI and MOI (trade name, manufactured by SHOWA DENKO K.K.)

The polymer used in the method iii) may further include other copolymerization component.

In the method iii), the type of the monomer having a polymerizable group to be reacted with the polymer having a reactive group may change according to the type of the reactive group in the polymer. Examples of the combination of the reactive group in the polymer and the functional group in the monomer are shown in the following Table 1.

TABLE 1

| reactive group in the polymer | functional group in the monomer |
| --- | --- |
| carboxyl group | carboxyl group |
| carboxyl group | epoxy group |
| carboxyl group | isocyanate group |
| carboxyl group | halogenated benzyl group |
| hydroxyl group | carboxyl group |
| hydroxyl group | epoxy group |
| hydroxyl group | isocyanate group |
| hydroxyl group | halogenated benzyl group |
| isocyanate group | hydroxyl group |
| isocyanate group | carboxyl group |
| epoxy group | carboxyl group |

Examples of the monomer having the aforementioned functional group include acrylic acid, glycigyl acrylate, CYCLOMER A (trade name, manufactured by DAICEL-CYTEC COMPANY LTD.), KARENZ AOI (trade name, manufactured by SHOWA DENKO K.K.), methacrylic acid, glycidyl methacrylate, CYCLOMER M (trade name, manufactured by DAICEL-CYTEC COMPANY LTD.) and KARENZ MOI (trade name, manufactured by SHOWA DENKO K.K.)

The specific polymer as synthesized according to the aforementioned method preferably includes each of the following units at the following ratio with respect to the total amount of copolymerization units.

The unit having an interactive group is preferably included at a ratio of 5 to 80 mol %, more preferably 10 to 70 mol %, with respect to the total amount of copolymerization units, from the viewpoint of adsorption property with respect to a plating catalyst.

The unit having a radical polymerizable group is preferably included at a ratio of 5 to 50 mol %, more preferably 5 to 30 mol %, with respect to the total amount of copolymerization units, from the viewpoint of reactivity (curability and polymerizability) and suppression of gelation upon synthesis.

The unit having an ionic polar group is preferably included at a ratio of 20 to 70 mol %, more preferably 20 to 60 mol %, with respect to the total amount of copolymerization units, from the viewpoint of developability with an aqueous solution and moisture-proof adhesiveness. This ratio is particularly preferably in a range of 30 to 50 mol %, since both of the developability and the moisture-proof adhesiveness can be achieved more effectively.

One particularly preferred embodiment of the specific polymer according to the invention includes a unit having an interactive group at a ratio of 40 to 70 mol %, a unit having a radical polymerizable group at a ratio of 5 to 30 mol %, and a unit having an ionic polar group at a ratio of 20 to 50 mol %, respectively.

One most preferred embodiment of the specific polymer according to the invention includes a unit having an interactive group at a ratio of 40 to 60 mol %, a unit having a radical polymerizable group at a ratio of 10 to 20 mol %, and a unit having an ionic polar group at a ratio of 30 to 50 mol %, respectively.

The value of ionic polarity (an acid value when the ionic polar group is a carboxyl group) of the specific polymer is preferably 1.5 to 7.0 mmol/g, more preferably 1.7 to 5.0 mmol/g, yet more preferably 1.9 to 5.0 mmol/g, and particularly preferably 1.9 to 4.5 mmol/g. When the value of ionic polarity is within the above range, the specific polymer can be provided with developability with an aqueous solution, while suppressing the reduction in adhesiveness with time under hot and humid conditions.

The optimal number of the unit and the value of ionic polarity may change depending on the molecular weight of the unit having an ionic polar group. In this case, optimization of the value of ionic polarity to be within the above range is given priority.

It should be noted that in the method iii), in which the polymerizable group is introduced in the polymer by a reaction, part of the polymerizable group may remain to form a forth unit if it is difficult to accomplish the introduction at a ratio of 100%.

The weight average molecular weight of the specific polymer according to the invention is preferably 3,000 to 150,000, more preferably 5,000 to 100,000. In particular, from the viewpoint of polymerization sensitivity, the weight average molecular weight of the specific polymer according to the invention is preferably 20,000 or more. Further, in view of increasing the thickness of the layer to be plated that is obtained by photo-curing so that more amount of plating catalyst or a precursor thereof can be adsorbed to the layer, the weight average molecular weight of the specific polymer according to the invention is particularly preferably 60,000 or more. The upper limit of the weight average molecular weight is preferably 150,000.

The weight average molecular weight here refers to a value as measured by GPC (solvent: N-methyl pyrolidone) in terms of polystyrene. For example, the weight average molecular weight can be measured under the following conditions.

Guard column: TOSOH TSK GUARD COLUMN SUPER AW-H (trade name, manufactured by TOSOH CORPORATION) Separating column: TOSOH TSKGEL SUPER AWM-H (trade name, manufactured by TOSOH CORPORATION, three columns of 6.0 mm×15 cm are connected)

Eluting agent: N-methyl pyrolidone (containing 10 mM of LiBr)

Flow rate: 0.35 mL/min

Detection method: RI

Temperatures: 40° C. at column, 40° C. at inlet, and 40° C. at RI

Sample concentration: 0.1 wt %

Infusion amount: 60 μL

Regarding the polymerization degree, the specific polymer according to the invention is preferably a 20-mer or more, more preferably a 30-mer or more. Further, the specific polymer according to the invention is preferably a 1,500-mer or less, more preferably a 1,000-mer or less.

The composition for forming a layer to be plated according to the invention preferably includes, when only an organic solvent is used for the solvent, the specific polymer as mentioned above at an amount of 0.01 to 50% by mass, more preferably 0.01 to 30% by mass, with respect to the total amount of the composition.

Further, as mentioned later, when a mixture of water and a water-soluble organic solvent is used for the solvent, the specific polymer is preferably contained in the composition at an amount of 0.01 to 25% by mass, more preferably 0.01 to 15% by mass, with respect to the total amount of the composition.

Solvent

The composition for forming a layer to be plated according to the invention preferably includes a solvent capable of dissolving the specific polymer as mentioned above.

Examples of the solvent that can be used include alcohol solvents such as methanol, ethanol, propanol, ethylene glycol, glycerin and propylene glycol monomethyl ether; acids such as acetic acid; ketone solvents such as acetone, methyl ethyl ketone and cyclohexanone; amide solvents such as formamide, dimethylacetoamide and N-methyl pyrrolidone; nitrile solvents such as acetonitrile and propionitrile; ester solvents such as methyl acetate and ethyl acetate; carbonate solvents such as dimethyl carbonate and diethyl carbonate; and other solvents such as ether solvents, glycol solvents, amine solvents, thiol solvents and halogen solvents.

When the composition contains the specific polymer that has a cyano group as an interactive group, a solvent having a boiling point of 50 to 150° C. is preferably used in view of handleability. These solvents may be used alone or in combination of two or more kinds.

-Water Soluble Organic Solvent-

By neutralizing the ionic polar group with a base to improve hydrophilicity of the composition according to the invention, water may be used as a solvent. In view of coating suitability in application of the composition, it is preferred to use water and a water soluble organic solvent in combination. In this case, the amount of the organic solvent is preferably from 0.1 to 40% by mass with respect to the total amount of the solvent. The water soluble organic solvent here refers to a solvent that can dissolve in water at an amount in the above range. Any organic solvent having this property can be used as a solvent for the composition without being particularly limited. Examples of the water soluble organic solvent include ketone-based solvent, ester-based solvent, alcohol-based solvent, ether-based solvent, amine-based solvent, thiol-based solvent and halogen-based solvent.

Examples of the ketone-based solvent include 4-hydroxy-4-methyl-2-pentanone, γ-butyrolactone and hydroxyacetone.

Examples of the ester-based solvent include ethyl acetate, ethyl 2-(2-ethoxyethoxy)acetate, ethylene glycol monomethyl ether acetate, diethylene glycol monoethyl ether acetate, methyl cellosolve acetate, 2-hydroxyethyl acrylate, hydroxypropyl acrylate, methyl glycolate and ethyl glycolate.

Examples of the alcohol-based solvent include methanol, ethanol, isopropyl alcohol, normal propyl alcohol, 3-acetyl-1-propanol, 2-(allyloxy)ethanol, 2-aminoethanol, 2-amino-2-methyl-1-propanol, (±)-2-amino-1-propanol, 3-amino-1-propanol, 2-dimethylaminoethanol, 2,3-epoxy-1-propanol, ethylene glycol, 2-fluoroethanol, diacetone alcohol, 2-methylcyclohexanol, 4-hydroxy-4-methyl-2-pentanone, glycerin, 2,2',2''-nitrilotriethanol, 2-pyridine methanol, 2,2,3,3-tetrafluoro-1-propanol, 2-(2-aminoethoxy)ethanol, 2-[2-(benzyloxy)ethoxy]ethanol, 2,3-butanediol, 2-butoxyethanol, 2,2'-thiodiethanol, 1,3-butanediol, 1,4-butanediol, 2,3-butanediol, 2-methyl-2,4-pentanediol, 1,3-propanediol, diglycerin, 2,2'-methyliminodiethanol and 1,2-pentanediol.

Examples of the ether-based solvent include bis(2-ethoxyethyl)ether, bis[2-(2-hydroxyethoxy)ethyl]ether, 1,2-bis(2-methoxyethoxy)ethane, bis[2-(2-methoxyethoxy)ethyl]ether, bis(2-methoxyethyl)ether, 2-(2-butoxyethoxy)ethanol, 2-[2-(2-chloroethoxy)ethoxy]ethanol, 2-ethoxyethanol, 2-(2-ethoxyethoxy)ethanol, 2-isobutoxy ethanol, 2-(2-isobutoxyethoxy)ethanol, 2-isopropoxyethanol, 2-[2-(2-methoxyethoxy)ethoxy]ethanol, 2-(2-methoxyethoxy)ethanol, 1-ethoxy-2-propanol, 1-methoxy-2-propanol, tripropylene glycol monomethyl ether, methoxy acetate and 2-methoxy ethanol.

Examples of the glycol-based solvents include diethylene glycol, triethylene glycol, ethylene glycol, hexaethylene glycol, propylene glycol, dipropylene glycol and tripropylene glycol.

Examples of the amine-based solvent include N-methyl-2-pyrolidone and N,N-dimethyl formamide.

Examples of the thiol-based solvent include mercaptoacetic acid and 2-mercaptoethanol.

Examples of the halogen-based solvent include 3-bromobenzylalcohol, 2-chloroethanol and 3-chloro-1,2-propanediol.

Other than the above examples, various kinds of organic solvent as shown in the following Table 2 may be used as the water soluble organic solvent.

-Water-

The water used in the composition according to the invention preferably includes no impurities, such as RO water, deionized water, distilled water and purified water. Among these, deionized water and distilled water are more preferred.

-Additives for Improving Solubility of Specific Polymer-

When a mixture of water and water soluble organic solvent is used for the composition according to the invention, an additive can be used for improving the solubility of the specific polymer.

For example, when the specific polymer (i.e., a solute) has an acidic group such as a carboxyl group, solubility of the specific polymer in the mixture of water and water soluble organic solvent can be improved by forming a salt of the

TABLE 2

| | | |
|---|---|---|
| Acrylic acid | 2-(dimethylamino) ethyl acrylate | Acetylmethylcarbinol |
| 1-amino-4-methylpiperazine | 3-aldehydepyridine | Isobutyric acid |
| Aluminium ethyl acetoacetate diisopropylate (water soluble type) | | Ethyl glycol |
| Ethylene glycol monobutyl ether | Ethylene chlorohydrin | N-ethylmorpholine |
| Ethylenediamine | 3-ethoxy propylamine | Formic acid (86% or more) |
| Isoamyl formate | Acetic acid | 1,4-diaminobutane |
| 1,2-diaminopropane | 1,3-diaminopropane | 3-diethylaminopropylamine |
| N,N-diethylethanolamine | cyclohexylamine | N,N-dimethylacetamide |
| Di-n-butoxy-bis(triethanolaminato)titanium | | Dimethylaminopropylamine |
| 2-dimethylaminoacetoaldehyde dimethyl acetal | | N,N-dimethyl ethanol amine |
| 2,5-dimethyl pyrazine | Pyrethrum (for stored grain: emulsion) | Hydrated hydrazine (79% or less) |
| Sodium alcoholate (liquid) | Tetramethyl-1,3-diaminopropane | Sodium methoxide |
| 1,1,3-trihydrotetrafluoropropanol | Ethyl lactate | Methyl lactate |
| α-picoline | β-picoline | γ-picoline |
| Hydrazine (79% of less) | Propionic acid | Propylene chlorohydrin |
| Benzylaminopurine (3% emulsion) | Trimethyl borate | Methylaminopropylamine |
| N-methylpiperazine | 2-methylpyrazine | 3-methoxypropylamine |
| 2-mercaptoethanol | Morpholine | Diethylenetriamine |
| N,N-dimethyl acrylamide | Dimethylaminopropyl methacrylamide | Dimethylsulfoxide |
| N,N-dimethylaminopropyl acrylamide | | (−)-D-diisopropyl tartrate |
| Hydrated hydrazine (80% or more) | Sulfolane (anhydride is a solid that is not dangerous) | Thioglycolic acid |
| Thiodiglycol | Tetraethylene pentamine | n-tetradecane |
| N,N,N',N'-tetramethyl-1,6-hexamethylene diamine | | Triethyl phosphate (TEP) |
| Triethylene glycol | Triethylene tetramine | Trimethyl phosphate |
| d-valerolactone | Bisaminopropyl piperazine | Hydrazine (80% or more) |
| 2-hydroxyethyl acylate | 2-hydroxyethyl aminopropylamine | Hydroxyethyl pyperazine |
| 4-hydroxy-2-butanone | Vinyltris(β-methoxyethoxy)silane | 2-pyridine methanol |
| 3-pyridine methanol | 4-pyridine methanol | Pyruvic acid |
| Phenethylamine | Formamide | 1,3-butanediol |
| 1,4-butanediol | Butyldiglycol | γ-butyrolactone |
| Furfuryl alcohol | Hexylene glycol | Benzylamine |
| Pentaethylene hexamine | Polyethylene glycol diglycidyl ether (n = about 13 or less) | |
| Polypropylene glycol diglycidyl ether (n = about 11 or less) | | Methacrylic acid |
| 2-hydroxyethyl methacrylate | Methyliminobispropylamine | N-methylethanolamine |
| N-methyl-N,N'-diethanolamine | 3-methyl-3-methoxybutyl acetate | β-mercaptopropionic acid |
| Monoethylene glycol acetate | | |

The water soluble organic solvent according to the invention preferably has a boiling point of from 70 to 150° C., more preferably from 65 to 120° C., from the viewpoint of ease of evaporation. Preferable examples of the water soluble organic solvent having a boiling point in the above range include ethanol (boiling point: 78° C.), isopropyl alcohol (boiling point: 82° C.), n-propyl alcohol (boiling point: 97° C.), THF (boiling point: 66° C.), 1-methoxy-2-propanol (boiling point: 119° C.) and MEK (boiling point: 80° C.).

Further, when a mixture of water and a water soluble organic solvent is used, the mixture preferably has a flash point of 30° C. or more, more preferably 40° C. or more, and further preferably 60° C. or more, from the viewpoint of operation suitability.

The flash point according to the invention refers to a value as measured based on JIS-K 2265 (Tag closed cup method).

acidic group such as sodium carboxylate. A basic compound can be used as an additive for converting the carboxyl group into sodium carboxylate, and examples of the basic compound include sodium hydrogen carbonate, sodium carbonate, sodium hydroxide, tetramethyl ammonium hydroxide, potassium hydrogen carbonate, potassium carbonate, potassium hydroxide, lithium hydrogen carbonate, lithium carbonate, lithium hydroxide, methylamine, dimethylamine, trimethylamine, ethylamine, diethylamine, triethylamine, butylamine, dibutylamine, tributylamine, ammonia, DBU and DBN. Among these, sodium hydrogen carbonate, sodium carbonate and sodium hydroxide are particularly preferred in view of solubility in water and the optimum basicity.

(Radical Generating Agent)

The composition according to the invention preferably includes a radical generating agent in order to improve the sensitivity of the composition to the applied energy.

Examples of the radical generating agent that may be used in the invention include aromatic ketones, onium salt compounds, organic peroxides, thio compounds, hexaaryl biimidazole compounds, ketoxime ester compounds, borate compounds, azinium compounds, active ester compounds, carbon-halogen bond-containing compounds, and pyridium compounds.

(Sensitizer)

The composition according to the invention may include a sensitizer in addition to the radical generating agent, in order to further improve the sensitivity of the composition to light when energy is applied by light irradiation.

The sensitizer is exited by actinic energy rays and interacts with the radical generating agent (for example, energy transfer or electron transfer), thereby promoting generation of radicals.

The sensitizer that may be used in the invention is not particularly limited, and may be selected from known sensitizers in accordance with the wavelength of light used for the irradiation.

Specific examples thereof include known polynuclear aromatic compounds (such as pyrene, perylene and triphenylene), xanthenes (such as fluorescein, eosin, erythrosine, Rhodamine B and rose bengal), cyanines (such as indocarbocyanine, thiacarboxyanine and oxacarbocyanine), merocyanines (such as merocyanine and carbomerocyanine), thiazines (such as thionine, methylene blue and toluidine blue), acridines (such as acridine orange, chloroflavine and acriflavine), anthraquinones (such as anthraquinone), squaryliums (such as squarylium), acridones (such as acridone, chloroacridone, N-methyl acridone, N-butyl acridone and N-butylchloroacridone), and coumalins (such as 3-(2-benzofuroyl)-7-diethylamino coumalin, 3-(2-benzofuroyl)-7-(1-pyrrolidinyl)coumalin, 3-benzoyl-7-diethylamino coumalin, 3-(2-methoxybenzoyl)-7-diethylamino coumalin, 3-(4-dimethylaminobenzoyl)-7-diethylamino coumalin, 3,3'-carbonylbis(5,7-di-n-propoxy coumalin), 3,3'-carbonylbis(7-diethylamino coumalin), 3-benzoyl-7-methoxy coumalin, 3-(2-furoyl)-7-diethylamino coumalin, 3-(4-diethylamino cinnamoyl)-7-diethylamino coumalin, 7-methoxy-3-(3-pyridylcarbonyl)coumalin, 3-benzoyl-5,7-dipropoxy coumalin, and the coumalin compounds described in JP-A Nos. 5-19475, 7-271028, 2002-363206, 2002-363207, 2002-363208 and 2002-363209).

The combination of the photo-polymerization initiator and the sensitizer may be selected from, for example, the electron transfer-type initiation system described in JP-A No. 2001-305734 including: (1) a combination of electron-donative initiator and sensitizing dye; (2) a combination of electron-receptive initiator and sensitizing dye; and (3) a combination of electron-donative initiator, sensitizing dye and electron-receptive initiator (ternary initiation system).

In the invention, one preferable example of the above combination is a triazine-based photo-polymerization initiator and a sensitizing dye having a maximum absorption at a wavelength in the range of from 360 to 700 nm.

Other examples of the sensitizer include sensitizers having a basic nucleus, sensitizers having an acidic nucleus, and sensitizers having a fluorescent whitener.

These sensitizers are preferably included in the composition according to the invention at an amount of from about 1% by mass to about 30% by mass, with respect to the total amount of the specific polymer.

(Surfactant)

The composition according to the invention may include a surfactant.

The surfactant that may be used in the invention is not particularly limited as long as it is soluble to the aforementioned solvent. Examples of such a surfactant include anionic surfactants such as sodium n-dodecylbenzenesulfonate; cationic surfactants such as n-dodecyltrimethylammonium chloride; nonionic surfactants such as polyoxyethylene nonylphenol ether (examples of commercially available products include EMULGEN 910, trade name, manufactured by KAO CORP.), polyoxyethylene sorbitan monolaurate (examples of commercially available products include TWEEN 20, trade name, manufactured by TOKYO CHEMICAL INDUSTRY CO., LTD.), and polyoxyethylene lauryl ether.

(Plastisizer)

The composition according to the invention may include a plasticizer. The plasticizer may be selected from typical plasticizers. It is also possible to use a plasticizer having a high boiling point such as esters of phthalic acid (dimethyl ester, diethyl ester, dibutyl ester, di-2-ethylhexyl ester, di-normal-octyl ester, diisononyl ester, dinonyl ester, diisodecyl ester, butylbenzyl ester, and the like), esters of adipic acid (dioctyl ester, diisononyl ester, and the like), esters of azelaic acid (dioctyl ester and the like), esters of sebacic acid (dibutyl ester, dioctyl ester, and the like), tricresyl phosphate, tributyl acetylcitrate, epoxidized soybean oil, trioctyl trimellitate, chlorinated paraffins, dimethylacetamide, and N-methylpyrrolidone.

(Polymerization Inhibitor)

A polymerization inhibitor may be added to the composition according to the invention, as necessary. Examples of the polymerization inhibitor that may be used include hydroquinones such as hydroquinone, di-tertiary-butyl hydroquinone and 2,5-bis(1,1,3,3-tetramethylbutyl)hydroquinone; phenols such as p-methoxyphenol and phenol; benzoquinones; free radicals such as TEMPO (2,2,6,6-tetramethyl-1-piperidinyloxy free radical) and 4-hydroxy-TEMPO; phenothiazines; nitrosoamines such as N-nitrosophenylhydroxyamine and an aluminum salt thereof, and catechols.

(Curing Agent and Curing Accelerator)

When an adhesion-aiding layer (described later) is provided under the layer formed from the composition according to the invention, a curing agent and/or a curing accelerator may be added to the composition in order to accelerate the curing of the adhesion-aiding layer. For example, when an epoxy compound is included in the adhesion-aiding layer, examples of the curing agent and/or curing accelerator include polyaddition-type compounds such as aliphatic polyamines, alicyclic polyamines, aromatic polyamines, polyamides, acid anhydrides, phenols, phenol novolacs, polymercaptans, compounds having two or more active hydrogen atoms; and catalyst-type compounds such as aliphatic tertiary amines, aromatic tertiary amines, imidazole compounds, and Lewis acid complexes.

Examples of those that initiate curing upon application of heat, light, humidity, pressure, acid, base or the like include diethylenetriamine, triethylenetetramine, tetraethylenepentamine, diethylaminopropylamine, polyamideamine, menthenediamine, isophoronediamine, N-aminoethylpiperazine, 3,9-bis(3-aminopropyl)-2,4,8,10-tetraoxyspiro(5,5)undecane adduct, bis(4-amino-3-methylcyclohexyl)methane, bis(4-aminocyclohexyl)methane, m-xylenediamine, diaminodiphenylmethane, m-phenylenediamine, diaminodiphenylsulfone, dicyandiamide, adipic acid dihydrazide, phthalic anhydride, tetrahydrophthalic anhydride, hexahydrophthalic anhydride, methyltetrahydrophthalic anhydride, methylhexahydrophthalic anhydride, methylnadic anhydride, dodecylsuccinic anhydride, chlorendic anhydride, pyromellitic anhydride, benzophenonetetracarboxylic acid anhydride, ethylene glycol bis(anhydro trimellitate), methylcyclohexene tetracarboxylic acid anhydride, trimellitic anhydride, polyazelaic anhydride, phenol novolac, xylylene novolac, bisphenol A novolac, triphenylmethane novolac, biphenyl novolac, dicyclopentadiene phenol novolac, terpene phenol novolac, polymercaptan, polysulfide, 2,4,6-tris(dimethylaminomethyl)phenol, 2,4,6-tris(dimethylaminomethyl)phenol-tri-2-ethylhexanoate, benzyldimethylamine, 2-(dimethylaminomethyl)phenol, 2-methylimidazole, 2-ethyl-4-methylimidazole, 2-undecylimidazole, 2-heptadecylimidazole, 2-phenylimidazole, 1-benzyl-2-methylimidazole, 1-cyanoethyl-2-methylimidazole, 2,4-diamino-6-(2-methylimidazolyl-(1))-ethyl S-triazine, $BF_3$ monoethylamine complex, Lewis acid complexes, organic acid hydrazides, diaminomaleonitrile, melamine derivatives, imidazole derivatives, polyamine salts, aminimide compounds, aromatic diazonium salts, diaryliodonium salts, triarylsulfonium salts, triarylselenium salts, ketimine compounds, and the like.

The curing agent and/or the curing accelerator is preferably added to the composition according to the invention at an amount of from 0 to about 50% by mass with respect to the non-volatile components that remain after the solvent has been removed, from the viewpoint of coating suitability of the composition, adhesion of the layer to the substrate or the plating film, or the like.

The curing agent and/or the curing accelerator may also be added to the adhesion-aiding layer. In this case, the total amount of the curing agent and/or the curing accelerator to be added to these two layers preferably satisfies the above range.

(Other Additives)

The composition according to the invention may further include other additives such as a rubber component (such as CTBN), a flame retardant (such as a phosphorus-based flame retardant), a diluent, a thixotropic agent, a pigment, a defoaming agent, a leveling agent, or a coupling agent. These additives may also be added to the adhesion-aiding layer, as necessary.

By using a composition prepared by appropriately mixing the specific polymer and other components such as the above, it is possible to optimize the properties of the layer formed from the composition, such as the thermal expansion coefficient, glass transition temperature, Young's modulus, Poisson's ratio, rupture stress, yield stress, or thermal decomposition temperature. In particular, it is preferred that the rupture stress, yield stress and thermal decomposition temperature be as high as possible.

The thermal durability of the layer formed from the composition according to the invention can be measured by a temperature cycle test, a thermal aging test, a reflow test, or the like. For example, with respect to the state of thermal decomposition, if the mass reduction after being exposed to an environment of 200° C. for 1 hour is 20% or less, it can be evaluated that the layer has a sufficient level of thermal durability.

<Method of Producing Metal Pattern Material>

The method of producing a metal pattern material according to the invention include: (1) contacting the composition according to the invention to a substrate and applying energy to cure the composition at a portion to which the energy has been applied; (2) forming a patterned layer by developing an uncured portion of the composition with an aqueous solution; (3) applying the plating catalyst or the precursor thereof to the patterned layer; and (4) performing plating with respect to the plating catalyst or the precursor thereof.

In the following, each of the steps (1) to (4) will be explained.

Step (1)

In step (1), after contacting the composition according to the invention to a substrate, energy is applied to a portion of the composition to cure the composition at this portion.

In one preferable embodiment, the specific polymer in the layer formed from the composition (layer to be plated) is bound to the substrate via a radical polymerizable group included in the molecule of the specific polymer.

When contacting the composition to the substrate, the application amount of the composition is preferably from 0.1 to 10 $g/m^2$, more preferably from 0.5 to 5 $g/m^2$, in terms of solid content, from the viewpoint of achieving a sufficient level of interaction with the plating catalyst or a precursor thereof.

When the composition including the specific polymer is applied onto the substrate and dried to form a layer including the specific polymer, the layer may be left to stand at 20 to 40° C. for 0.5 to 2 hours to remove the residual solvent, between the processes of application and drying.

The contacting of the composition to the substrate may be performed by immersing the substrate in the composition. However, from the viewpoint of handleability or production efficiency, it is preferred to form a layer from the composition on the surface of the substrate (or the surface of the adhesion-aiding layer) by an application method.

When the substrate is a resin film and the layer is formed from the composition on both sides of the resin film, the application method is also preferred in view of ease of formation of the layer on both sides of the substrate at the same time.

(Application of Energy)

In step (1), energy is applied to the composition that has been contacted to the substrate.

The application of energy is preferably conducted by heating or light irradiation. In view of ease of formation of a patterned image, light irradiation is preferred.

The light irradiation can be conducted using a UV lamp, visible rays or the like. Examples of the light source include a mercury lamp, a metal halide lamp, a xenon lamp, a chemical lamp, and a carbon arc lamp. Examples of radiation rays include electron beams, X rays, ion beams, and far-infrared rays. Moreover, g-line rays, i-line rays, Deep-UV rays, high-density energy beams (laser beams) are also applicable.

Specific embodiments of the energy application that are typically conducted include scan-exposure using infrared laser beams, high-illuminance flash exposure using a xenon discharge lamp or the like, and irradiation with an infrared lamp.

The time for the light irradiation may differ depending on the reactivity of the specific polymer or the type of light source, but is typically from 10 seconds to 5 hours.

When energy is applied by heat, the heating may be conducted using an air blowing-type dryer, an oven, an infrared dryer, a heating drum, or the like. When energy is applied by heating the composition in a patterned manner, irradiation with infrared rays or far-infrared rays can be performed.

When energy is applied to the composition in such a manner as described above, curing reaction of the specific polymer occurs only at a portion to which energy has been applied. As a result, only the composition at this portion is cured.

<Substrate>

The substrate used in step (1) is not particularly limited as long as it can retain its shape, and preferably has a surface capable of chemically bonding to the specific polymer. Specifically, the substrate itself may have an ability of generating radicals upon irradiation with light, or the substrate may include a base member and an intermediate layer (such as an adhesion-aiding layer as described later) having an ability of generating radicals upon irradiation with light that is formed on the base member.

(Base Member and Substrate)

The base member used in the invention is preferably a plate-shaped, dimensionally stable object. Examples thereof include a sheet of paper, a sheet of paper laminated with a resin (such as polyethylene, polypropylene or polystylene), a sheet of a metal (such as aluminum, zinc or copper), a film of a resin (such as cellulose diacetate, cellulose triacetate, cellulose propionate, cellulose butyrate, cellulose acetate, cellulose nitrate, polyethylene terephthalate, polyethylene, polystyrene, polypropylene, polycarbonate, polyvinyl acetal, polyimide, epoxy, bismaleimide resin, polyphenylene oxide, liquid crystal polymer or polytetrafluoroethylene), and a sheet of paper or a plastic film on which a metal as mentioned above is laminated or evaporated. In the invention, a base member formed from an epoxy resin or a polyimide resin is preferred.

When the surface of the base member has a function of forming a state in which the specific polymer is directly chemically bound thereto, the base member itself may be used as the substrate.

A base member including a polyimide having a polymerization initiation site in the skeleton thereof, as described in paragraphs [0028] to [0088] of JP-A No. 2005-281350, may also be used for the substrate in the invention.

The metal pattern material produced by the method of the invention may be applied to a semiconductor package, various kinds of electrical wiring boards, and the like. When the metal pattern material is used in such applications, it is preferable to use a substrate including an insulating resin as described below. Specifically, it is preferable to use a substrate formed from an insulating resin, or a substrate including a base member and a layer formed from an insulating resin on the base member.

Known insulating resin composition may be used to obtain a substrate formed from an insulating resin or a layer formed from an insulating resin. The insulating resin composition may include an additive of various kinds in addition to the resin as a main component, according to purposes. For example, a polyfunctional acrylate monomer may be added for the purpose of increasing the strength of insulating layer, or inorganic or organic particles may be added for the purpose of increasing the strength of insulating layer and improving the electrical properties thereof.

Here, the "insulating resin" according to the invention refers to a resin having an insulating property within a tolerable level for use in known insulating films or insulating layers. Therefore, the resin does not need to have a completely insulating property, as long as it satisfies the requirements according to purposes.

The insulating resin may be a thermosetting resin, a thermoplastic resin, or a mixture thereof. Specifically, examples of the thermosetting resin include epoxy resins, phenolic resins, polyimide resins, polyester resins, bismaleimide resins, polyolefin-based resins, isocyanate-based resins, and the like.

Examples of the epoxy resins include cresol novolac-type epoxy resins, bisphenol A-type epoxy resins, bisphenol F-type epoxy resins, phenol novolac-type epoxy resins, alkylphenol novolac-type epoxy resins, biphenol F-type epoxy resins, naphthalene-type epoxy resins, dicyclopentadiene-type epoxy resins, epoxides of a condensate formed from a phenol and an aromatic aldehyde having a phenolic hydroxyl group, triglycidyl isocyanurate, alicyclic epoxy resins, and the like. These resins may be used alone or may be used in combination of two or more kinds. By including the insulating resin as mentioned above, excellent heat resistance or the like can be achieved.

Examples of the polyolefin-based resins include polyethylene, polystyrene, polypropylene, polyisobutylene, polybutadiene, polyisoprene, cycloolefin-based resins, copolymers of these resins, and the like.

Examples of the thermoplastic resins include phenoxy resins, polyether sulfone, polysulfone, polyphenylene sulfone, polyphenylene sulfide, polyphenyl ether, polyether imide, and the like.

Other thermoplastic resins include 1,2-bis(vinylphenylene)ethane resin, or a modified resin obtained from a 1,2-bis(vinylphenylene)ethane resin and a polyphenylene ether resin (described in Satoru Amou et al., Journal of Applied Polymer Science, Vol. 92, pp. 1252-1258 (2004)), liquid crystal polymers (for example, VECSTAR, trade name, manufactured by KURARAY CO., LTD.), fluororesins (PTFE), and the like.

The thermoplastic resin and the thermosetting resin may be used alone or in combination. These resins may be combined for the purpose of compensating the defects of each resin so as to achieve better effects. For example, since a thermoplastic resin such as polyphenylene ether (PPE) has a low resistance to heat, this resin can be alloyed with a thermosetting resin or the like. Examples thereof include alloys of PPE with epoxy or triallyl isocyanate, and alloys of a PPE resin to which a polymerizable functional group has been introduced with another thermosetting resin.

Further, a cyanate ester is a resin that exhibits the most excellent dielectric properties among the thermosetting resins, but is typically used as a modified resin with an epoxy resin, a maleimide resin, a thermoplastic resin or the like, rather than being used as it is. Details of these resins are described in "Electronic Technologies" No. 2002/9, p. 35. Furthermore, a mixture of an epoxy resin and/or a phenolic resin as a thermosetting resin, and a phenoxy resin and/or polyethersulfone (PES) as a thermoplastic resin, may also be used for the purpose of improving dielectric properties.

The insulating resin composition may include a compound having a polymerizable double bond, such as an acrylate or methacrylate compound, particularly preferably a polyfunctional acrylate or methacrylate compound, in order to promote crosslinking reaction. Other examples of the compound containing a polymerizable double bond include those obtained by subjecting a part of a thermosetting resin or a thermoplastic resin (for example, an epoxy resin, a phenolic resin, a polyimide resin, a polyolefin resin, or a fluororesin) to a (meth)acrylation reaction using methacrylic acid, acrylic acid or the like.

A composite of a resin and other component may also be used as the insulating resin composition for the purpose of reinforcing the properties of a resin film, such as mechanical strength, heat resistance, weather resistance, flame retardancy, water resistance or electrical properties. Examples of the material that may be used to form a composite include paper, glass fiber, silica particles, phenol resins, polyimide resins, bismaleimide triazine resins, fluororesins, polyphenylene oxide resins, or the like.

Further, as necessary, the insulating resin composition may be compounded with one or more kinds of filler for use in general resin materials for wiring boards. Examples of the filler include inorganic fillers such as silica, alumina, clay, talc, aluminum hydroxide and calcium carbonate, and organic fillers such as cured epoxy resin, crosslinked benzoguanamine resin and crosslinked acrylic polymer. Among them, silica is preferably used as the filler.

The insulating resin composition may also include one or more additives of various kinds as necessary, such as a colorant, a flame retardant, a tackifier, a silane coupling agent, an antioxidant, an ultraviolet absorbent, or the like.

When such a material as above is added to the insulating resin composition, the total amount of the same is preferably 1 to 200% by mass, more preferably 10 to 80% by mass, with respect to the amount of the resin. If the above amount is less than 1% by mass, effects of reinforcing the aforementioned properties may not be achieved, while if the above amount is more than 200% by mass, properties that are inherent to the resin, such as strength, may deteriorate.

The substrate for use in the aforementioned applications is preferably formed from an insulating resin having a dielectric constant (relative dielectric constant) at 1 GHz of 3.5 or less, or formed from a base member and a layer formed from the above insulating resin that is formed on the base member. Further, the substrate is preferably formed from an insulating resin having a dielectric loss tangent at 1 GHz of 0.01 or less, or has a layer formed from the insulating resin formed on a base member.

The dielectric constant and the dielectric loss tangent of an insulating resin can be measured by standard methods. For example, these properties can be measured by using a cavity resonator perturbation method (for example, using a tester that measures $\epsilon r$ and $\tan \delta$ for an ultra-thin sheet, manufactured by KEYCOM CORP.)

As mentioned above, it is also advantageous to select the insulating resin material from the viewpoint of dielectric constant or dielectric loss tangent. Examples of the insulating resin having a dielectric constant of 3.5 or less and a dielectric loss tangent of 0.01 or less include liquid crystal polymers, polyimide resins, fluororesins, polyphenylene ether resins, cyanate ester resins, bis(bisphenylene)ethane resins, and modified resins of these resins.

The substrate for use in the invention preferably has a surface roughness of 500 nm or less, more preferably 100 nm or less, even more preferably 50 nm or less, and most preferably 20 nm or less, in view of applications to semiconductor packages, various electrical wiring boards, and the like. The surface roughness of the substrate (when an intermediate layer such as an adhesion-aiding layer is provided, the surface roughness of this layer) is preferably smaller, since the electric loss at the time of transmitting electricity at high frequency can be reduced when the metal pattern material is used for wiring or the like.

When the substrate is a plate-shaped object such as a resin film (plastic film), the layer to be plated can be formed on both sides of the substrate by conducting steps (1) and (2) to both sides of the substrate. When the layer is formed on both sides of the substrate, a material having a metal film on both sides can be obtained by further conducing steps (3) and (4).

In the following, the adhesion-aiding according to the invention is described. If the substrate is a plate-shaped object, the adhesion-aiding layer may be formed on both sides of the substrate.

(Adhesion-aiding Layer)

The adhesion-aiding layer according to the invention is an intermediate layer that secures adhesion between the substrate and the layer to be plated. This layer may have an affinity with the substrate and the layer to be plated, or may have an ability of forming chemical bonding upon reaction with the specific polymer during curing.

The adhesion-aiding layer is preferably formed from a resin composition having a favorable adhesion with respect to the substrate, and a compound that generates radicals upon irradiation with light. When the resin in the resin composition has a site that generates radicals, the compound that generates radicals upon irradiation with light may not be used.

When the substrate is formed from a known insulating resin that is used in multilayer boards, build-up boards or flexible substrates, the adhesion-aiding layer according to the invention is preferably formed from an insulating resin composition, in view of adhesion to the substrate.

In the following, an embodiment in which the substrate is formed from an insulating resin and the adhesion-aiding layer is formed from an insulating resin composition is described.

The insulating resin composition that forms the adhesion-aiding layer may include the same insulating resin as the electrically insulating resin that forms the substrate, or may include a different resin. However, the insulating resin composition that forms the adhesion-aiding layer preferably includes an insulating resin having similar thermal physical properties, such as the glass transition temperature, elastic modulus or linear coefficient of expansion, to those of the insulating resin that forms the substrate. Specifically, for example, the insulating resin that forms the adhesion-aiding layer is preferably the same kind as the insulating resin that forms the substrate in view of adhesion of the adhesion-aiding layer to the substrate.

The insulating resin composition may further include inorganic or organic particles, in order to improve the strength or electrical properties of the adhesion-aiding layer.

In the invention, the insulating resin used for the adhesion-aiding layer refers to a resin having an insulating property within a tolerable level for use in known insulating films. Therefore, a resin having an insulating property that is satisfactory for the intended use is applicable in the invention, even if the resin is not completely insulating.

Specific examples of the insulating resin include a thermosetting resin, thermoplastic resin or a combination of these resins.

Examples of the thermosetting resin include an epoxy resin, a phenol resin, a polyimide resin, a polyester resin, a bismaleimide resin, a polyolefin resin, and an isocyanate resin. Examples of the thermoplastic resin include a phenoxy resin, polyether sulfone, polysulfone, polyphenylene sulfone, polyphenylene sulfide, polyphenyl ether, polyether imide, and an ABS resin. These thermosetting resins and the thermoplastic resins may be used alone or in combination of two or more kinds.

It is also possible to form the adhesion-aiding layer using a resin having a skeleton that generates an active site capable of interacting with a plating catalyst-receptive photosensitive resin composition. Examples of such a resin include a polyimide having a polymerization initiation site in its skeleton as described in paragraphs [0018] to [0078] of JP-A No. 2005-307140.

The adhesion-aiding layer according to the invention may include various kinds of compounds as long as the effects of the invention are not impaired.

Specific examples of such a compound include rubbers, substances such as SBR latex, binders for improving film properties, plasticizers, surfactants, and viscosity modifiers.

A composite of a resin and other component(s) may also be used to form the adhesion-aiding layer, for the purpose of reinforcing the properties of the resin film such as mechanical strength, heat resistance, weather resistance, flame retardancy, water resistance or electrical properties. Examples of the material that may be used to form a composite include paper, glass fiber, silica particles, phenol resins, polyimide resins, bismaleimide triazine resins, fluororesins, polyphenylene oxide resins, or the like.

Further, as necessary, the adhesion-aiding layer may be compounded with one or more kinds of filler that are commonly used in a resin material for wiring boards. Examples of the filler include inorganic fillers such as silica, alumina, clay, talc, aluminum hydroxide and calcium carbonate, and organic fillers such as cured epoxy resin, crosslinked benzoguanamine resin and crosslinked acrylic polymer.

The adhesion-aiding layer may also include one or more additives of various kinds as necessary, such as a colorant, a flame retardant, a tackifier, a silane coupling agent, an antioxidant, an ultraviolet absorbent, or the like.

When such a material as above is added to the adhesion-aiding layer, the total amount of the same is preferably 0 to 200% by mass, more preferably 0 to 80% by mass, with respect to the amount of the resin as a main component. When the adhesion-aiding layer and the substrate that are adjacent to each other have the same or similar physical properties with respect to heat or electricity, these additives may not be added. When the above amount of the additive is more than 200% by mass, properties that are inherent to the resin, such as strength, may deteriorate.

The adhesion-aiding layer preferably includes, as mentioned above, a resin composition and a compound that generates radicals upon irradiation with light.

In the invention, known photopolymerization initiators can be used as the compound that generates radicals upon irradiation with light.

Examples of the photopolymerization initiator include acetophenones such as p-tert-butyl trichloroacetophenone, 2,2'-diethoxyacetophenone, and 2-hydroxy-2-methyl-1-phenylpropan-1-one; ketones such as benzophenone, 4,4'-bis-dimethylaminobenzophenone, 2-chlorothioxanthone, 2-methylthioxanthone, 2-ethylthioxanthone, and 2-isopropylthioxanthone; benzoin ethers such as benzoin, benzoin methyl ether, benzoin isopropyl ether, and benzoin isobutyl ether; benzyl ketals such as benzyl dimethyl ketal and hydroxycyclohexyl phenyl ketone; sulfonium salts such as triphenyl sulfonium chloride, triphenyl sulfonium pentafluoro phosphate; and iodonium salts such as diphenyl iodonium chloride and diphenyl iodonium sulfate.

The photopolymerization initiator (compound that generates radicals upon irradiation with light) is included in the adhesion-aiding layer preferably at an amount of 0.1 to 50% by mass, more preferably 1.0 to 30% by mass, in terms of solid content.

The thickness of the adhesion-aiding layer according to the invention is typically 0.1 to 10 μm, preferably 0.2 to 5 μm. When the adhesion-aiding layer has a thickness within this range, a sufficient level of adhesion to the adjacent substrate or the layer to be plated can be achieved. Further, a similar level of adhesion to that of a layer formed from a typical adhesive can be achieved, while reducing the layer thickness as compared with the layer formed from the adhesive.

The surface of the adhesion-aiding layer according to the invention preferably has a surface roughness Rz of 3 μm or less, more preferably 1 μm or less, as measured in accordance with a ten-point average height method as stipulated by JIS B 0601 (1994), from the viewpoint of improving the properties of the plating metal film to be formed on the adhesion-aiding layer.

When the adhesion-aiding layer has a smooth surface (i.e., with a surface roughness within the above range), a substrate that can be suitably used for printing circuit boards having an extremely fine pattern (for example, a circuit pattern having a line/space value of 25/25 μm or less) can be obtained.

The adhesion-aiding layer can be formed on the substrate by a known method such as an application method, a transfer method or a printing method.

As necessary, the adhesion-aiding layer may be formed in a patterned manner by a printing method (such as gravure printing, screen printing, flexographic printing, inkjet printing and imprint printing), a development method (such as wet etching, dry etching, ablasion, curing/plasticizing (negative/positive) with light), or the like.

The adhesion-aiding layer may be subjected to a curing process by applying energy of some kind, after being formed on the substrate. Examples of the energy to be applied include light, heat, pressure and electron beams, but heat or light is typically used in this embodiment. When energy is applied by heat, it is preferable to conduct heating at 100 to 300° C. for 5 to 120 minutes. The conditions for heating may differ depending on the type of material for the substrate, the type of resin composition that forms the adhesion-aiding layer, or the curing temperatures of these materials, but are preferably selected from the range of 120 to 220° C. and 20 to 120 minutes.

The curing treatment may be performed immediately after the formation of the adhesion-aiding layer. Alternatively, by conducting a pre-curing treatment for about 5 to about 10 minutes after the formation of the adhesion-aiding layer, the curing treatment can be performed after completing all processes subsequent to the formation of the adhesion-aiding layer.

After the formation of the adhesion-aiding layer, the surface of the same may be roughened by a dry or wet method in order to improve its adhesiveness with respect to the layer to be plated that is to be formed on the adhesion-aiding layer. Examples of the dry roughening method include mechanical polishing such as buffing or sand blasting, and plasma etching. Examples of the wet roughening method include a chemical treatment using an oxidant such as permanganate, bichromate, ozone, hydrogen peroxide/sulfuric acid, or nitric acid; a strong base; or a resin-swelling solvent.

Step (2)

In step (2) of the method of producing a metal pattern material according to the invention, the uncured portion of the composition on the substrate is removed by developing with an aqueous solution to form a patterned layer to be plated.

(Development with Aqueous Solution)

Examples of the aqueous solution used in this step include an acidic aqueous solution, a neutral aqueous solution, and an alkali aqueous solution.

Examples of the acidic aqueous solution include an aqueous solution of hydrochloric acid, sulfuric acid or nitric acid.

Examples of the neutral aqueous solution include a surfactant (anionic, nonionic or cationic) that is dissolved in water.

The aqueous solution is preferably an alkali aqueous solution, and specific examples thereof include an aqueous solution of sodium hydroxide, potassium hydroxide, magnesium hydroxide, calcium hydroxide, sodium carbonate, potassium carbonate, magnesium carbonate, calcium carbonate, sodium hydrogen carbonate, potassium hydrogen carbonate, magnesium hydrogen carbonate and calcium hydrogen carbonate.

The concentration of the aqueous solution is typically 0.01 to 10% by mass, and this can be determined according to the pKa value of the ionic polar group or the desired time for development.

The development can be performed by shower washing, immersion or the like. The development may also be performed by immersing the substrate in the development solution while stirring it.

The temperature for development is preferably selected from room temperature to 50° C., and the time for development is preferably selected from 5 seconds to 10 minutes.

Through the development process as mentioned above, a patterned layer to be plated is formed on the substrate. The thickness of the layer to be plated is preferably 0.2 to 1.5 µm, more preferably 0.3 to 1.5 µm, and particularly preferably 0.6 to 1.2 µm.

Step (3)

In step (3), a plating catalyst or a precursor thereof is applied to the layer to be plated that has been formed in the previous step (2).

In this step, the applied plating catalyst or the precursor thereof is adhered (adsorbed) to the interactive group of the specific polymer that is included in the layer to be plated.

Since the plating catalyst or the precursor thereof functions as a catalyst for plating or an electrode in the subsequent step (4), it is selected depending on the type of the plating to be performed in step (4).

In the invention, the plating catalyst or the precursor thereof used in this step is preferably an electroless plating catalyst or a precursor thereof.

(Electroless Plating Catalyst)

In the invention, the electroless plating catalyst may be any substance as long as it serves as an active nucleus during electroless plating. Examples thereof include metals having a catalytic ability of a self-catalytic reduction reaction (metals capable of electroless plating and having an ionization tendency that is not more than that of Ni), and specific examples include Pd, Ag, Cu, Ni, Al, Fe, Co and the like. Among them, those capable of multidentate coordination are preferred. From the viewpoints of the number of types of functional group capable of coordination and a high degree of catalytic ability, Ag and Pd are particularly preferred.

The electroless plating catalyst may be used in the form of a metal colloid. In general, a metal colloid may be produced by reducing metal ions in a solution including a charged surfactant or a charged protective agent. The electrical charge of the metal colloid can be controlled by the surfactant or protective agent included herein.

(Electroless Plating Catalyst Precursor)

The electroless plating catalyst precursor used in this step is not particularly limited, as long as it can act as an electroless plating catalyst through a chemical reaction. In general, metal ions of the metals as mentioned above as the electroless plating catalyst are used. A metal ion that serves as an electroless plating catalyst precursor becomes a zero-valent metal that serves as an electroless plating catalyst through a reduction reaction. The metal ion as an electroless plating catalyst precursor may be reduced to a zero-valent metal to obtain an electroless plating catalyst by performing a separate reduction reaction, after applying the same to the layer to be plated and prior to immersing the substrate in an electroless plating bath; or may be reduced to a metal (electroless plating catalyst) during immersing the substrate in an electroless plating bath, using a reducing agent contained in the electroless plating bath.

In practical use, the metal ion (electroless plating catalyst precursor) is applied to the layer to be plated by using a metal salt. The metal salt is not particularly limited as long as it can dissolve in an appropriate solvent and dissociate into a metal ion and a base (anion). Specific examples thereof include $M(NO_3)_n$, $MCl_n$, $M_{2/n}(SO_4)$, $M_{3/n}(PO_4)$ (M represents an n-valent metal atom). The resultant of dissociation of the above-mentioned metal salts may be suitably used as the metal ion. Specific examples of the metal ion include an Ag ion, a Cu ion, an Al ion, a Ni ion, a Co ion, a Fe ion, and a Pd ion. Among them, those capable of multidentate coordination are preferred. From the viewpoints of the number of types of a functional group capable of coordination and the catalytic ability, an Ag ion and a Pd ion are particularly preferred.

In the invention, one preferable example of the electroless plating catalyst or the precursor thereof is a palladium compound. The palladium compound functions as a plating catalyst (palladium) or a plating catalyst precursor (palladium ion), which serves as an active nucleus and causes precipitation of a metal during plating. The palladium compound is not particularly limited as long as it includes palladium and functions as an active nucleus during plating, and examples thereof include a palladium (II) salt, a palladium (0) complex, and a palladium colloid.

Examples of the palladium salt include palladium acetate, palladium chloride, palladium nitrate, palladium bromate, palladium carbonate, palladium sulfate, bis(benzonitrile) dichloropalladium (II), bis(acetonitrile)dichloropalladium (II) and bis(ethylenediamine)palladium (II) chloride. Among these, palladium nitrate, palladium acetate, palladium sulfate and bis(acetonitrile)dichloropalladium (II) are preferred from the viewpoint of handleability and solubility.

Examples of the palladium complex include tetrakis(triphenylphosphine)palladium (0) complex and tris(dibenzylideneacetone)dipalladium complex (0).

The palladium colloid is in the form of particles of palladium (0). The particle size is not particularly limited, but is preferably 5 to 300 nm, more preferably 10 to 100 nm, from the viewpoint of stability in a solution. As necessary, the palladium colloid may include a metal other than palladium, such as tin. One examples of the palladium colloid is a tin-palladium colloid. The palladium colloid may be prepared by a known method, or may be a commercially available product. For example, the palladium colloid may be prepared by reducing palladium ions in a solution including a charged surfactant or a charged protection agent.

Another preferable examples of the electroless plating catalyst or the precursor thereof is silver or silver ions, from the viewpoint of being selectively adsorbed to the layer to be plated.

When the silver ions are used as the plating catalyst precursor, those obtained from dissociation of the following silver compounds are suitable used.

Silver nitrate, silver acetate, silver sulfate, silver carbonate, silver cyanate, silver thiocyanate, silver chloride, silver bromate, silver chromate, silver chloranilate, silver salicylate, silver diethyldithiocarbamate, and silver p-toluenesulfonate. Among these, silver nitrate is preferred from the viewpoint of solubility in water.

The metal (electroless plating catalyst) or a metal salt (electroless plating catalyst precursor) can be applied to the layer to be plated by preparing a dispersion by dispersing the metal in a suitable medium, or preparing a solution including dissociated metal ions by dissolving the metal salt in a suitable solvent; and then applying the dispersion or the solution to the layer to be plated. Alternatively, the substrate with the layer to be plated formed thereon may be immersed in the dispersion or the solution.

It is also possible to add the electroless plating catalyst or the precursor thereof to the composition for forming the layer to be plated, and then applying the composition to the substrate in step (1). Namely, a patterned layer to be plated including the plating catalyst or the precursor thereof can be formed on the substrate by contacting the composition including the specific polymer and the electroless plating catalyst or the precursor thereof to the substrate, and then performing light irradiation and development to the composition. In this way, steps (1) to (3) can be conducted in a single process.

When the substrate is a resin film and the layer to be plated is formed on both sides of the resin film, contacting of the composition to the substrate is preferably performed by the immersion method as mentioned above, so that the electroless plating catalyst or the precursor thereof can be contacted to the layer to be plated formed on both sides of the resin film in a single process.

By contacting the electroless plating catalyst or the precursor thereof to the layer to be plated as mentioned above, the electroless plating catalyst or the precursor thereof can be adsorbed to the interactive group in the layer to be plated by means of interaction due to an intermolecular force (such as van der Waals' force) or a coordination bond of lone-pair electrons.

From the viewpoint of achieving the above adsorption to a sufficient level, the concentration of metal in the dispersion, solution or composition, or the concentration of metal ions in the solution, is preferably 0.001 to 50% by mass, more preferably 0.005 to 30% by mass.

The time for contacting is preferably 30 seconds to 24 hours, more preferably 1 minute to 1 hour.

When a palladium compound is used in the solution, dispersion or composition that includes the electroless plating catalyst or the precursor thereof, the content of the palladium compound is preferably 0.001 to 10% by mass, more preferably 0.005 to 5% by mass, yet more preferably 0.1 to 1% by mass, with respect to the total amount of the solution, dispersion or composition.

When a silver compound is used in the solution, dispersion or composition that includes the electroless plating catalyst or the precursor thereof, the content of the silver compound is preferably 0.1 to 20% by mass, more preferably 0.1 to 20% by mass, yet more preferably 0.5 to 10% by mass, with respect to the total amount of the solution, dispersion or composition.

In either of the above two cases, when the content of the metal compound is too small, precipitation in the subsequent plating may not easily occur, and when the content of the meal compound is too large, precipitation may occur in an undesired portion to cause inconveniences in removing etching residues.

The amount of the electroless plating catalyst or the precursor thereof to be adsorbed may differ depending on the type of electroless plating catalyst or precursor thereof.

The amount of silver ions to be adsorbed to the layer to be plated is preferably 300 mg/m$^2$ or more, more preferably 500 mg/m$^2$ or more, and further preferably 600 mg/m$^2$ or more, from the viewpoint of performing favorable precipitation in the electroless plating. From the viewpoint of forming a metal pattern that is highly adhesive to the substrate, the amount of silver ions to be adsorbed is preferably 1000 mg/m$^2$ or less.

The amount of palladium ions to be adsorbed to the layer to be plated is preferably 5 mg/m$^2$ or more, more preferably 10 mg/m$^2$ or more, from the viewpoint of performing favorable precipitation in the electroless plating. From the viewpoint of forming a metal pattern that is highly adhesive to the substrate, the amount of palladium ions to be adsorbed is preferably 1000 mg/m$^2$ or less.

(Other Catalysts)

In the invention, when electroplating is directly conducted in the subsequent step (4) without performing electroless plating, a zero-valent metal may be used as the catalyst for the electroplating. Examples of the zero-valent metal include Pd, Ag, Cu, Ni, Al, Fe and Co. Among these, those capable of multidentate coordination are preferable, and Pd, Ag and Cu are particularly preferred in view of adsorbability (attachability) to the interactive group (such as a cyano group).

(Organic Solvent and Water)

The plating catalyst or the precursor thereof can be applied in the form of a dispersion or a solution (catalyst solution), as mentioned above.

In the invention, an organic solvent or water can be used for the catalyst solution.

By including the organic solution, permeability of the layer to be plated to the plating catalyst or the precursor thereof can be improved, and the plating catalyst or the precursor thereof can be adsorbed to the interactive group in the layer to be plated with high efficiency.

Water may be used in the catalyst solution according to the invention. The water preferably includes no impurities. From this point of view, RO water, deionized water, distilled water and purified water are preferred, and deionized water and distilled water are particularly preferred.

The organic solvent for use in preparing the catalyst solution is not particularly limited as long as it can penetrate into the layer to be plated. Specific examples thereof include acetone, methyl acetoacetate, ethyl acetoacetate, ethylene glycol diacetate, cyclohexanone, acetylacetone, acetophenone, 2-(1-cyclohexenyl)cyclohexanone, propylene glycol diacetate, triacetine, diethylene glycol diacetate, dioxane, N-methyl pyrrolidone, dimethyl carbonate, and dimethyl cellosolve.

Other examples of the organic solvent include diacetone alcohol, γ-butyrolactone, methanol, ethanol, isopropyl alcohol, n-propyl alcohol, propylene glycol monomethyl ether, methyl cellosolve, ethyl cellosolve, ethylene glycol tertiary butyl ether, tetrahydrofuran, 1,4-dioxane, n-methyl-2-pyrrolidone, triethylene glycol monomethyl ether, diethylene glycol dimethyl ether, and diethylene glycol diethyl ether.

From the viewpoint of compatibility with the plating catalyst or the precursor thereof, or permeability to the organic solvent of the layer to be plated, acetone, dimethyl carbonate, dimethyl cellosolve, triethylene glycol monomethyl ether, diethylene glycol dimethyl ether and diethylene glycol diethyl ether are particularly preferred.

The catalyst solution according to the invention may include other additives according to the intended use. Examples of the other additives include a swelling agent (e.g., organic compounds such as ketones, aldehydes, ethers and esters) and a surfactant (e.g., anionic, cationic, amphoteric, nonionic, low-molecular or high-molecular surfactants).

Through step (3) as mentioned above, interaction can be formed between the interactive group in the layer to be plated and the plating catalyst or the precursor thereof.

Step (4)

In step (4) of the method of producing a metal pattern material according to the invention, a plating film is formed by performing plating with respect to the layer to be plated to which the electroless plating catalyst or the precursor thereof has been applied. The obtained plating film may exhibit excellent conductivity and adhesiveness.

The type of plating to be performed in this step may be electroless plating, electroplating or the like, which can be selected according to the function of the plating catalyst or the precursor thereof that has been interacting with the layer to be plated.

Namely, in this step, either electroplating or electroless plating may be performed with respect to the layer to be plated to which the electroless plating catalyst or the precursor thereof has been applied.

Among these, in the invention, electroless plating is preferably performed from the viewpoint of forming a hybrid structure that occurs in the layer to be plated, or improving the adhesion between the layer to be plated and the plating film. In a more preferred embodiment, electroplating is performed subsequent to the electroplating so as to form a plating film to a desired thickness.

In the following, a preferred embodiment of the plating is described.

(Electroless Plating)

Electroless plating is an operation of precipitating a metal by means of a chemical reaction, using a solution in which ions of the metal to be precipitated are dissolved.

The electroless plating in this step is carried out by, for example, washing the substrate to which the electroless plating catalyst has been applied with water to remove an excessive amount of electroless plating catalyst (metal), and then immersing the substrate in an electroless plating bath. A generally known electroless plating bath can be used in this process.

When the substrate with the layer to be plated to which an electroless plating catalyst precursor has been applied is immersed in the electroless plating bath in such a state that that the electroless plating catalyst precursor is adsorbed to (or impregnated in) the layer to be plated, the substrate is washed with water to remove an excessive amount of the precursor (metal salt or the like) prior to immersing the substrate in the electroless plating bath. In this case, reduction of the plating catalyst precursor and the subsequent electroless plating are carried out in the electroless plating bath. A generally known electroless plating bath may be used in this case, too.

The reduction of the electroless plating catalyst precursor may be carried out in a separate process prior to the electroless plating, by using a catalyst activating solution (reducing solution). The catalyst activating solution is a solution in which a reducing agent that reduces the electroless plating catalyst precursor (typically metal ions) to a zero-valent metal is dissolved, and the concentration of the reducing agent is generally in the range of 0.1 to 50% by mass, preferably in the range of 1 to 30% by mass. Examples of the reducing agent that may be used include boron-based reducing agents such as sodium borohydride and dimethylamine borane, and reducing agents such as formaldehyde and hypophosphorous acid.

The electroless plating bath typically includes, as main components in addition to a solvent, (1) metal ions for the plating, (2) a reducing agent, and (3) an additive that enhances the stability of the metal ions (stabilizer). The electroless plating bath may further include a known additive such as a stabilizer for the plating bath, in addition to the above components.

The organic solvent used in the plating bath should be soluble in water. From this point of view, ketones such as acetone or alcohols such as methanol ethanol or isopropanol are preferably used.

Examples of the metal used in the electroless plating bath include copper, tin, lead, nickel, gold, palladium and rhodium. From the viewpoint of electrical conductivity, copper and gold are preferred.

The optimal reducing agent and additive may be selected in combination with the metal to be used. For example, the electroless plating bath of copper contains $CuSO_4$ as a copper salt, HCOH as a reducing agent, and a chelating agent that serves as a stabilizer of copper ions such as EDTA or Rochelle salt, and trialkanolamine or the like. The electroless plating bath of CoNiP contains cobalt sulfate or nickel sulfate as a metal salt, sodium hypophosphite as a reducing agent, and sodium malonate, sodium malate or sodium succinate as a complexing agent. The electroless plating bath of palladium contains $(Pd(NH_3)_4)Cl_2$ as a metal ion, $NH_3$ or $H_2NNH_2$ as a reducing agent, and EDTA as a stabilizer. These plating baths may also contain other components than the above-described components.

The thickness of the plating film formed by the electroless plating may be controlled by adjusting the concentration of the metal ion in the plating bath, the immersion time in the plating bath, the temperature of the plating bath, or the like. From the viewpoint of electroconductivity, the thickness of the plating film is preferably 0.1 μm or more, more preferably 0.2 to 2 μm.

In this regard, when electroplating is performed using the plating film formed by the electroless plating as a conductive layer, the plating film formed in the electroless plating needs to have a thickness of at least 0.1 μm in a uniform manner.

The immersion time in the plating bath is preferably from 1 minute to about 6 hours, more preferably from 1 minute to about 3 hours.

When the plating film is observed at a cross-section with a scanning electron microscope (SEM), it can be confirmed that microparticles of the electroless plating catalyst or the plating metal are dispersed in the layer to be plated at high density, and that the plating metal has further precipitated on the layer to be plated. Since the interface between the layer to be plated and the plating film is in a hybrid state of a polymer composite and microparticles, favorable adhesiveness can be achieved even when the interface between the layer to be plated (organic component) and the inorganic substance (catalyst metal or plating metal) is flat and smooth (for example, Ra is 1.5 μm or less at an area of 1 $mm^2$).

(Electroplating)

In this step, if the plating catalyst or the precursor thereof that has been applied in the previous step (3) functions as an electrode, electroplating can be performed with respect to the layer to be plated to which the catalyst or the precursor thereof has been applied.

It is also possible to perform electroplating subsequent to the above-described electroless plating, by using a plating film that has been formed in the electroless plating as an electrode. In this way, a further metal film can be readily formed to a desired thickness based on the plating film that is closely adhered to the substrate. Therefore, it is possible to form a metal film to a desired thickness in accordance with the intended use.

The electroplating according to the invention can be performed by a conventionally known method. Examples of the metal that may be used in the electroplating include copper, chromium, lead, nickel, gold, silver, tin, and zinc. From the viewpoint of electrical conductivity, copper, gold and silver are preferred, and copper is more preferred.

The thickness of the metal film obtained by the electroplating can be controlled by adjusting the concentration of the metal contained in the plating bath, current density, or the like.

In applications of typical electrical wiring or the like, the film thickness of the metal film is preferably 0.5 μm or more, more preferably 1 to 30 μm or more, from the viewpoint of electrical conductivity.

In this regard, the narrower (finer) the width of the electrical wiring is, the thinner the thickness of the electrical wiring needs to be so as to maintain a certain aspect ratio. Therefore, the thickness of the plating film formed in the electroplating can be arbitrarily determined without being limited to the above range.

The plating film may also be formed by preliminarily mixing the plating catalyst or the precursor thereof in the composition for forming the layer to be plated, and then forming the layer to be plated from this composition on the substrate by the aforementioned method of application, extrusion, laminating or the like.

In this method, since the layer to be plated includes the plating catalyst or the precursor thereof without performing step (c), improvements in operation efficiency or productivity can be achieved.

<Metal Pattern Material>

The metal pattern material of the invention can be obtained through the aforementioned steps of the method of producing a metal pattern material of the invention.

According to this method, by using a resin film or the like as the substrate, a metal pattern material having a metal pattern on both sides of the resin film can be obtained. The metal pattern material of the invention has a metal pattern that is highly adhesive to the substrate.

The metal pattern material of the invention preferably has a plating film that is formed on portions of a substrate surface having a roughness of 500 nm or less (more preferably 100 nm or less). Further, the metal pattern material preferably exhibits an adhesion between the substrate and the metal pattern of 10 or less in 100 squares, as measured by a cross cut test stipulated by JIS K5600. Namely, the metal pattern material of the invention achieves excellent adhesion between the substrate and the metal pattern even when the substrate has a smooth surface.

The aforementioned value of surface roughness of the substrate is measured by cutting the substrate in a vertical manner to the substrate surface, and then observing a cross section of the substrate with an SEM.

More specifically, the above value of surface roughness refers to Rz as measured in accordance with JIS B0601 (i.e., the difference between the average value of five highest points and the average value of five lowest points).

The metal pattern material obtained by the method of producing a metal pattern material of the invention can be used in various applications such as semiconductor chips, electric circuit boards, FPCs, COFs, TABs, antennas, multilayer circuit boards, and mother boards.

The following are exemplary embodiment of the invention. However, the invention is not limited thereto.

1. A composition comprising a polymer, the polymer having a non-dissociative functional group that interacts with a plating catalyst or a precursor thereof, a radical polymerizable group, and an ionic polar group.

2. The composition according to <1>, wherein the polymer comprises a copolymer including a unit represented by the following formula (A), a unit represented by the following formula (B) and a unit represented by the following formula (C):

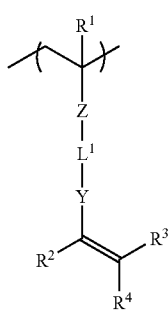
(A)

-continued

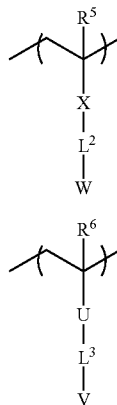

wherein in formulae (A) to (C), $R^1$ to $R^6$ each independently represent a hydrogen atom or an alkyl group that may be substituted or unsubstituted; X, Y, Z and U each independently represent a single bond, a divalent organic group that may be substituted or unsubstituted, an ester group, an amide group or an ether group; $L^1$, $L^2$ and $L^3$ each independently represent a single bond or a divalent organic group that may be substituted or unsubstituted; W represents a non-dissociative functional group that interacts with a plating catalyst or a precursor thereof, and V represents an ionic polar group.

3. The composition according to <2>, wherein in formula (B), W is a cyano group or an ether group.

4. The composition according to <2>, wherein in formula (C), V is a carboxyl group.

5. The composition according to <2>, wherein in formula (C), V is a carboxyl group and $L^3$ includes a four to eight-membered cyclic structure at a portion at which $L^3$ is connected to V.

6. The composition according to <2>, wherein in formula (C), V is a carboxyl group and $L^3$ has a chain length of 6 to 18 atoms.

7. The composition according to claim 2, wherein in formula (C), V is a carboxyl group, U is a single bond and $L^3$ is a single bond.

8. A method of forming a metal pattern material, the method comprising:

(1) contacting a composition to a substrate and applying energy to cure the composition at a portion to which the energy has been applied, the composition comprising a polymer having a non-dissociative functional group that interacts with a plating catalyst or a precursor thereof, a radical polymerizable group, and an ionic polar group;

(2) forming a patterned layer by developing an uncured portion of the composition with an aqueous solution;

(3) applying the plating catalyst or the precursor thereof to the patterned layer; and (4) performing plating with respect to the plating catalyst or the precursor thereof.

9. The method according to <8>, wherein the polymer comprises a copolymer including a unit represented by the following formula (A), a unit represented by the following formula (B) and a unit represented by the following formula (C):

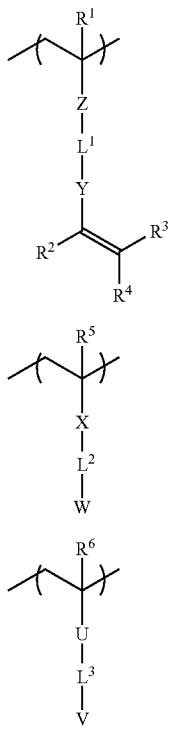

wherein in formulae (A) to (C), $R^1$ to $R^6$ each independently represent a hydrogen atom or an alkyl group that may be substituted or unsubstituted; X, Y, Z and U each independently represent a single bond, a divalent organic group that may be substituted or unsubstituted, an ester group, an amide group or an ether group; $L^1$, $L^2$ and $L^3$ each independently represent a single bond or a divalent organic group that may be substituted or unsubstituted; W represents a non-dissociative functional group that interacts with a plating catalyst or a precursor thereof, and V represents an ionic polar group.

10. The method according to <9>, wherein in formula (B), W is a cyano group or an ether group.
11. The method according to <9>, wherein in formula (C), V is a carboxyl group.
12. The composition according to <9>, wherein in formula (C), V is a carboxyl group and $L^3$ includes a four to eight-membered cyclic structure at a portion at which $L^3$ is connected to V.
13. The composition according to <9>, wherein in formula (C), V is a carboxyl group and $L^3$ has a chain length of 6 to 18 atoms.
14. The composition according to <9>, wherein in formula (C), V is a carboxyl group, U is a single bond and $L^3$ is a single bond.
15. The method according to <8>, wherein the plating is performed by electroless plating.
16. The method according to <15>, wherein electroplating is performed after the electroless plating.
17. The method according to <8>, wherein the substrate includes an intermediate layer and the composition contacts the intermediate layer.
18. The method according to <17>, wherein the intermediate layer comprises an insulating resin.
19. A metal pattern material formed using the method according to <8>.

EXAMPLES

In the following, details of the invention will be explained with reference to the Examines. However, the invention is not limited thereto. The terms "%" and "parts" are based on mass, unless otherwise specified.

Synthesis Example

Synthesis of Specific Polymer A 10 g of N,N-dimethylacetoamide were placed in a 500 ml three-neck flask, and were heated to 65° C. under a nitrogen stream. Then, 6.61 g of monomer M (following structure), 9.01 g of 2-cyanoethyl acrylate (manufactured by TOKYO CHEMICAL INDUSTRY CO., LTD.), 15.14 g of a monomer having a carboxyl group directly bound to an alicyclic structure (trade name: HOA-HH, following structure, manufactured by KYOEISHA CHEMICAL CO., LTD), and 10 g of a N,N-dimethylaceamide solution containing 0.32 g of 2,2'-azobis(2,4-dimethylvaleronitrile) (trade name: V-65, manufactured by WAKO PURE CHEMICAL INDUSTRIES, LTD.) were dropped in the flask over 4 hours. After the dropping, the content of the flask was stirred for 3 hours. Thereafter, 51 g of N-N-dimethylacetoamide were added to the flask and the reaction solution was cooled to room temperature.

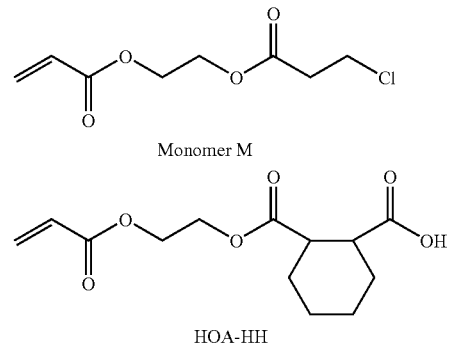

To the above reaction solution, 0.06 g of 4-hydroxy TEMPO (manufactured by TOKYO CHEMICAL INDUSTRY CO., LTD.) and 22.26 g of triethylamine were added and allowed to react at room temperature for 4 hours. Thereafter, 29 g of a 70% aqueous solution of methanesulfonic acid were added to the reaction solution. After the reaction, the reaction solution was subjected to re-precipitation with water and a solid was recovered. 19 g of specific polymer A (weight average molecular weight: 42,000) were obtained. The acid value of specific polymer A was 1.95 mmol/g.

Synthesis Example

Synthesis of Specific Polymer B1

18 g of N,N-dimethylacetoamide were placed in a 500 ml three-neck flask, and were heated to 65° C. under a nitrogen stream. Then, 20.7 g of monomer M, 12.5 g of 2-cyanoethyl acrylate (manufactured by TOKYO CHEMICAL INDUSTRY CO., LTD.), 21.6 g of acrylic acid (manufactured by TOKYO CHEMICAL INDUSTRY CO., LTD.), and 20 g of a N,N-dimethylaceamide solution containing 1.0 g of 2,2'-azobis(2,4-dimethylvaleronitrile) (trade name: V-65, manufactured by WAKO PURE CHEMICAL INDUSTRIES, LTD.) were dropped in the flask over 4 hours. After the dropping, the content of the flask was stirred for 3 hours. Thereafter, 91 g of N-N-dimethylacetoamide were added to the flask and the reaction solution was cooled to room temperature.

To the above reaction solution, 0.17 g of 4-hydroxy TEMPO (manufactured by TOKYO CHEMICAL INDUSTRY CO., LTD.) and 101.2 g of triethylamine were added and allowed to react at room temperature for 4 hours. Thereafter, 150 g of a 70% aqueous solution of methanesulfonic acid were added to the reaction solution. After the reaction, the reaction solution was subjected to re-precipitation with water and a solid was recovered. 25 g of specific polymer B1 (weight average molecular weight: 95,000) were obtained. The acid value of specific polymer B1 was 6.0 mmol/g.

Synthesis Example

Synthesis of Specific Polymer B2

20 g of N,N-dimethylacetoamide were placed in a 500 ml three-neck flask, and were heated to 65° C. under a nitrogen stream. Then, 20.7 g of monomer M, 20.5 g of 2-cyanoethyl acrylate (manufactured by TOKYO CHEMICAL INDUSTRY CO., LTD.), 14.4 g of acrylic acid (manufactured by TOKYO CHEMICAL INDUSTRY CO., LTD.), and 20 g of a N,N-dimethylaceamide solution containing 1.0 g of 2,2'-azobis(2,4-dimethylvaleronitrile) (trade name: V-65, manufactured by WAKO PURE CHEMICAL INDUSTRIES, LTD.) were dropped in the flask over 4 hours. After the dropping, the content of the flask was stirred for 3 hours. Thereafter, 91 g of N-N-dimethylacetoamide were added to the flask and the reaction solution was cooled to room temperature.

To the above reaction solution, 0.17 g of 4-hydroxy TEMPO (manufactured by TOKYO CHEMICAL INDUSTRY CO., LTD.) and 75.9 g of triethylamine were added and the reaction solution was allowed to react at room temperature for 4 hours. Thereafter, 112 g of a 70% aqueous solution of methanesulfonic acid were added to the reaction solution. After the reaction, the reaction solution was subjected to re-precipitation with water and a solid was recovered. 25 g of specific polymer B2 (weight average molecular weight: 74,000) were obtained. The acid value of specific polymer B2 was 4.0 mmol/g.

Synthesis Example

Synthesis of Specific Polymer B3

22 g of N,N-dimethylacetoamide were placed in a 500 ml three-neck flask, and were heated to 65° C. under a nitrogen stream. Then, 20.7 g of monomer M, 1.3 g of 2-cyanoethyl acrylate (manufactured by TOKYO CHEMICAL INDUSTRY CO., LTD.), 10.8 g of acrylic acid (manufactured by TOKYO CHEMICAL INDUSTRY CO., LTD.), and 22 g of a N,N-dimethylaceamide solution containing 1.0 g of 2,2'-azobis(2,4-dimethylvaleronitrile) (trade name: V-65, manufactured by WAKO PURE CHEMICAL INDUSTRIES, LTD.) were dropped in the flask over 4 hours. After the dropping, the content of the flask was stirred for 3 hours. Thereafter, 109 g of N-N-dimethylacetoamide were added to the flask and the reaction solution was cooled to room temperature.

To the above reaction solution, 0.17 g of 4-hydroxy TEMPO (manufactured by TOKYO CHEMICAL INDUSTRY CO., LTD.) and 50.6 g of triethylamine were added and the reaction solution was allowed to react at room temperature for 4 hours. Thereafter, 75 g of a 70% aqueous solution of methanesulfonic acid were added to the reaction solution. After the reaction, the reaction solution was subjected to re-precipitation with water and a solid was recovered. 35 g of specific polymer B3 (weight average molecular weight: 84,000) were obtained. The acid value of specific polymer B3 was 3.2 mmol/g.

Synthesis Example

Synthesis of Specific Polymer C 28 g of N,N-dimethylacetoamide were placed in a 500 ml three-neck flask, and were heated to 65° C. under a nitrogen stream. Then, 13.3 g of monomer M, 4.0 g of 2-cyanoethyl acrylate (manufactured by TOKYO CHEMICAL INDUSTRY CO., LTD.), 67.28 g of ω-carboxy-polycaprolactone monoacrylate (trade name: ARONIX M5300, manufactured by TOAGOSEI CO Ltd.), and 28 g of a N,N-dimethylaceamide solution containing 0.626 g of 2,2'-azobis(2,4-dimethylvaleronitrile) (trade name: V-65, manufactured by WAKO PURE CHEMICAL INDUSTRIES, LTD.) were dropped in the flask over 4 hours. After the dropping, the content of the flask was stirred for 3 hours. Thereafter, 141 g of N-N-dimethylacetoamide were added to the flask and the reaction solution was cooled to room temperature.

To the above reaction solution, 0.11 g of 4-hydroxy TEMPO (manufactured by TOKYO CHEMICAL INDUSTRY CO., LTD.) and 72.9 g of triethylamine were added and the reaction solution was allowed to react at room temperature for 4 hours. Thereafter, 98 g of a 70% aqueous solution of methanesulfonic acid were added to the reaction solution. After the reaction, the reaction solution was subjected to re-precipitation with water and a solid was recovered. 30 g of specific polymer C (weight average molecular weight: 35,000) were obtained. The acid value of specific polymer C was 2.83 mmol/g.

Synthesis Example

Synthesis of Specific Polymer D 13.4 g of N,N-dimethylacetoamide were placed in a 500 ml three-neck flask, and were heated to 65° C. under a nitrogen stream. Then, 13.22 g of monomer M, 17.80 g of 3-cyanopropyl acrylate (manufactured by TOKYO CHEMICAL INDUSTRY CO., LTD.), 9.23 g of acrylic acid (manufactured by TOKYO CHEMICAL INDUSTRY CO., LTD.), and 13 g of a N,N-dimethylaceamide solution containing 0.63 g of 2,2'-azobis(2,4-dimethylvaleronitrile) (trade name: V-65, manufactured by WAKO PURE CHEMICAL INDUSTRIES, LTD.) were dropped in the flask over 4 hours. After the dropping, the content of the flask was stirred for 3 hours. Thereafter, 67 g of N—N-dimethylacetoamide were added to the flask and the reaction solution was cooled to room temperature.

To the above reaction solution, 0.11 g of 4-hydroxy TEMPO (manufactured by TOKYO CHEMICAL INDUSTRY CO., LTD.) and 48.6 g of triethylamine were added and the reaction solution was allowed to react at room temperature for 4 hours. Thereafter, 72 g of a 70% aqueous solution of methanesulfonic acid were added to the reaction solution. After the reaction, the reaction solution was subjected to re-precipitation with water and a solid was recovered. 23 g of specific polymer D (weight average molecular weight: 58,000) were obtained. The acid value of specific polymer C was 3.72 mmol/g.

Example 1

Preparation of Composition for Forming Layer to be Plated 0.2 g of specific polymer A obtained by the above synthesis method, 0.04 g of sodium carbonate, 1.5 g of water and 0.3 g of acetonitrile were mixed and stirred, and a composition for forming a layer to be plated was prepared.

Preparation of Substrate

An adhesion-aiding layer was formed by applying a 9% cyclohexane solution of ABS resin (manufactured by SIGMA-ALDRICH JAPAN K.K.) onto a glass epoxy substrate by a spin coat method (conditions: 250 rpm for 5 seconds and 750 rpm for 20 seconds), and then drying it to form an adhesion-aiding layer. Substrate A1 was thus obtained.

Formation of Layer to be Plated

The composition for forming a layer to be plated was applied onto the adhesion-aiding layer of substrate A1 to a thickness of 1 μm by a spin coat method, and was dried at 80° C. for 30 minutes.

Thereafter, the composition was exposed to light in a patterned manner through a photomask for 300 seconds, using a UV exposing machine (product number: UVF-502S, lamp: UXM-501MD, manufactured by SAN-EI ELECTRIC CO., LTD.) at an irradiation power of 10 mW/cm$^2$ (measured by an accumulated UV meter UIT150 with a light-receiving sensor UVD-S254).

After the exposure, the substrate was immersed in a 1% $Na_2Co_3$ aqueous solution for 5 minutes, and was then washed with distilled water.

Substrate A2 having a patterned layer to be plated was thus obtained.

Application of plating catalyst

Substrate A2 with a layer to be plated was immersed in a 10% silver nitrate aqueous solution for 10 minutes, and was then immersed in acetone for washing.

Electroless Plating

Substrate A2 with a layer to be plated onto which a plating catalyst had been applied was subjected to electroless plating at 26° C. for 10 minutes, using an electroless plating bath having the following composition. The thickness of the obtained electroless plating film was 0.1 μm.

| Composition of electroless plating bath | |
|---|---|
| Distilled water | 774 g |
| ATS ADCOPPER IW-A (manufactured by OKUNO CHEMICAL INDUSTRIES, CO., LTD.) | 45 mL |
| ATS ADCOPPER IW-M (manufactured by OKUNO CHEMICAL INDUSTRIES, CO., LTD.) | 72 mL |
| ATS ADCOPPER IW-C (manufactured by OKUNO CHEMICAL INDUSTRIES, CO., LTD.) | 9 mL |
| NaOH | 1.98 g |
| 2,2'-bipyridyl | 1.8 mg |

Electroplating

Subsequently, electroplating was performed in a copper electroplating bath having the following composition at 3 A/dm$^2$ for 20 minutes, using the copper electroless plating film obtained in the electroless plating as a feed layer. The thickness of the obtained copper electroplating film was 18 μm.

Metal pattern material according to Example 1 was thus obtained.

| <Composition of electroplating bath> | |
|---|---|
| Copper sulfate | 38 g |
| Sulfuric acid | 95 g |
| Hydrochloric acid | 1 mL |
| COPPER GLEAM (manufactured by MELTEX INC.) | 3 mL |
| Water | 500 g |

Evaluation of Adhesion

The plating film obtained in Example 1 was subjected to a cross cut test (JIS-K5600). As a result, no peeling in 100 squares was observed.

Then, the plating film was subjected to a 90° peel strength measurement, using a tension tester (trade name: AUTOGRAPH, manufactured by SHIMADZU CORPORATION) at a width of 5 mm and a tension of 10 mm/min. The result was 0.7 kN/m.

Further, the plating film (metal pattern material) was left to stand at 70° C. and 95 RH % for 2.5 weeks, and then a cross cut test was conducted in the same manner as above. As a result, no peeling in 100 squares was observed.

Additionally, the plating film (metal pattern material) was immersed in water for one day, and then a cross cut test was conducted in the same manner as above. As a result, peeling was observed at 15 squares in 100 squares.

Example 2

Preparation of Composition for Forming Layer to be Plated 0.2 g of specific polymer B obtained by the above synthesis method, 0.057 g of sodium carbonate, 1.5 g of water and 0.3 g of acetonitrile were mixed and stirred, and a composition for forming a layer to be plated was prepared.

Using the above composition, formation of layer to be plated, application of plating catalyst, electroless plating and electroplating were performed in the same manner as Example 1, and meal pattern material according to Example 2 was obtained.

(Evaluation of Adhesion)

The plating film obtained in Example 2 was subjected to a cross cut test (JIS-K5600). As a result, no peeling in 100 squares was observed.

Then, the plating film was subjected to a 90° peel strength measurement, using a tension tester (trade name: AUTOGRAPH, manufactured by SHIMADZU CORPORATION) at a width of 5 mm and a tension of 10 mm/min. The result was 0.8 kN/m.

Further, the plating film (metal pattern material) was left to stand at 60° C. and 85 RH % for 10 days, and then a cross cut test was conducted in the same manner as above. As a result, peeling was observed at 10 squares in 100 squares.

Additionally, the plating film (metal pattern material) was immersed in water for one day, and then a cross cut test was conducted in the same manner as above. As a result, peeling was observed at 10 squares in 100 squares.

Example 3

Preparation of Composition for Forming Layer to be Plated 0.2 g of specific polymer B2 obtained by the above synthesis method, 0.037 g of sodium carbonate, 1.5 g of water and 0.3 g of acetonitrile were mixed and stirred, and a composition for forming a layer to be plated was prepared.

Using the above composition, formation of layer to be plated, application of plating catalyst, electroless plating and electroplating were performed in the same manner as Example 1, and meal pattern material according to Example 3 was obtained.

(Evaluation of Adhesion)

The plating film obtained in Example 3 was subjected to a cross cut test (JIS-K5600). As a result, no peeling in 100 squares was observed.

Then, the plating film was subjected to a 90° peel strength measurement, using a tension tester (trade name: AUTOGRAPH, manufactured by SHIMADZU CORPORATION) at a width of 5 mm and a tension of 10 mm/min. The result was 0.8 kN/m.

Further, the plating film (metal pattern material) was left to stand at 60° C. and 85 RH % for 10 days, and then a cross cut test was conducted in the same manner as above. As a result, peeling was observed at 8 squares in 100 squares.

Additionally, the plating film (metal pattern material) was immersed in water for one day, and then a cross cut test was conducted in the same manner as above. As a result, peeling was observed at 8 squares in 100 squares.

Example 4

Preparation of Composition for Forming Layer to be Plated 0.2 g of specific polymer B3 obtained by the above synthesis method, 0.04 g of sodium carbonate, 1.5 g of water and 0.3 g of acetonitrile were mixed and stirred, and a composition for forming a layer to be plated was prepared.

Using the above composition, formation of layer to be plated, application of plating catalyst, electroless plating and electroplating were performed in the same manner as Example 1, and meal pattern material according to Example 4 was obtained.

(Evaluation of Adhesion)

The plating film obtained in Example 4 was subjected to a cross cut test (JIS-K5600). As a result, no peeling in 100 squares was observed.

Then, the plating film was subjected to a 90° peel strength measurement, using a tension tester (trade name: AUTOGRAPH, manufactured by SHIMADZU CORPORATION) at a width of 5 mm and a tension of 10 mm/min. The result was 0.8 kN/m.

Further, the plating film (metal pattern material) was left to stand at 60° C. and 85 RH % for 10 days, and then a cross cut test was conducted in the same manner as above. As a result, no peeling in 100 squares was observed.

Additionally, the plating film (metal pattern material) was immersed in water for one day, and then a cross cut test was conducted in the same manner as above. As a result, no peeling in 100 squares was observed.

Example 5

Preparation of Composition for Forming Layer to be Plated 0.2 g of specific polymer C obtained by the above synthesis method, 0.03 g of sodium carbonate, 1.5 g of water and 0.3 g of acetonitrile were mixed and stirred, and a composition for forming a layer to be plated was prepared.

Using the above composition, formation of layer to be plated, application of plating catalyst, electroless plating and electroplating were performed in the same manner as Example 1, and meal pattern material according to Example 5 was obtained.

(Evaluation of Adhesion)

The plating film obtained in Example 5 was subjected to a cross cut test (JIS-K5600). As a result, no peeling in 100 squares was observed.

Then, the plating film was subjected to a 90° peel strength measurement, using a tension tester (trade name: AUTOGRAPH, manufactured by SHIMADZU CORPORATION) at a width of 5 mm and a tension of 10 mm/min. The result was 0.6 kN/m.

Further, the plating film (metal pattern material) was left to stand at 70° C. and 95 RH % for 3 weeks, and then a cross cut test was conducted in the same manner as above. As a result, no peeling in 100 squares was observed.

Additionally, the plating film (metal pattern material) was immersed in water for one day, and then a cross cut test was conducted in the same manner as above. As a result, peeling was observed at 17 squares in 100 squares.

Example 6

Substrate A1' was prepared in a similar manner to Example 1, except that IRG184 (trade name, manufactured by CIBA JAPAN K.K.) was added to the 9% cyclohexane solution containing ABS resin, at an amount of 10% with respect to the ABS resin.

The thus obtained substrate A1' was exposed to light in a patterned manner in a similar manner to Example 1, except that the exposure was conducted for 250 seconds. Substrate A2' having a patterned layer to be plated was thus obtained.

The patterned layer to be plated was formed in a favorable manner even though the time for exposure was reduced.

Thereafter, substrate A2' was subjected to application of a plating catalyst, electroless plating and electroplating in the same manner to Example 1. A metal pattern material according to Example 6 was thus obtained.

(Evaluation of Adhesion)

The plating film obtained in Example 6 was subjected to a cross cut test (JIS-K5600). As a result, no peeling in 100 squares was observed.

Then, the plating film was subjected to a 90° peel strength measurement, using a tension tester (trade name: AUTOGRAPH, manufactured by SHIMADZU CORPORATION) at a width of 5 mm and a tension of 10 mm/min. The result was 0.75 kN/m.

Further, the plating film (metal pattern material) was left to stand at 70° C. and 95 RH % for 3 weeks, and then a cross cut test was conducted in the same manner as above. As a result, no peeling in 100 squares was observed.

Additionally, the plating film (metal pattern material) was immersed in water for one day, and then a cross cut test was conducted in the same manner as above. As a result, peeling was observed at 13 squares in 100 squares.

Example 7

Preparation of Composition for Forming Layer to be Plated 0.2 g of specific polymer D obtained by the above synthesis method, 0.062 g of sodium carbonate, 1.5 g of water and 0.3 g of acetonitrile were mixed and stirred, and a composition for forming a layer to be plated was prepared.

Using the above composition, formation of layer to be plated, application of plating catalyst, electroless plating and electroplating were performed in the same manner as Example 1, and a meal pattern material according to Example 7 was obtained.

(Evaluation of Adhesion)

The plating film obtained in Example 7 was subjected to a cross cut test (JIS-K5600). As a result, no peeling in 100 squares was observed.

Then, the plating film was subjected to a 90° peel strength measurement, using a tension tester (trade name: AUTOGRAPH, manufactured by SHIMADZU CORPORATION) at a width of 5 mm and a tension of 10 mm/min. The result was 0.8 kN/m.

Further, the plating film (metal pattern material) was left to stand at 60° C. and 85 RH % for 10 days, and then a cross cut test was conducted in the same manner as above. As a result, peeling was observed at 3 squares in 100 squares.

Additionally, the plating film (metal pattern material) was immersed in water for one day, and then a cross cut test was conducted in the same manner as above. As a result, peeling was observed at 3 squares in 100 squares.

Example 8

Preparation of Composition for Forming Layer to be Plated 1 g of specific polymer B2 obtained by the above synthesis method and 0.17 g of sodium carbonate were dissolved in 3 g of water, and then 7 g of methanol were added thereto. The mixture was mixed and stirred, and a composition for forming a layer to be plated was prepared.

Using the above composition, formation of layer to be plated, application of plating catalyst, electroless plating and electroplating were performed in the same manner as Example 1, and a meal pattern material according to Example 8 was obtained.

(Evaluation of Adhesion)

The plating film obtained in Example 8 was subjected to a cross cut test (JIS-K5600). As a result, no peeling in 100 squares was observed.

Then, the plating film was subjected to a 90° peel strength measurement, using a tension tester (trade name: AUTOGRAPH, manufactured by SHIMADZU CORPORATION) at a width of 5 mm and a tension of 10 mm/min. The result was 0.8 kN/m.

Further, the plating film (metal pattern material) was left to stand at 60° C. and 85 RH % for 10 days, and then a cross cut test was conducted in the same manner as above. As a result, peeling was observed at 8 squares in 100 squares.

Additionally, the plating film (metal pattern material) was immersed in water for one day, and then a cross cut test was conducted in the same manner as above. As a result, peeling was observed at 8 squares in 100 squares.

Comparative Example 1

0.2 of comparative polymer E (synthesized by the method described later) and 1.8 g of acetone were mixed and stirred, and a composition for forming a layer to be plated was prepared.

Synthesis of Comparative Polymer E 10 mL of ethylene glycol diacetate were placed in a 500 ml three-neck flask and was heated to 80° C. Then, a mixture of 3.72 g of hydroxyethyl acrylate, 16.01 g of 2-cyanoethyl acrylate, 0.3684 g of V-601 (trade name, manufactured by WAKO PURE CHEMICAL INDUSTRIES, LTD.) and 10 mL of ethylene glycol diacetate was dropped into the flask over 4 hours. After the dropping, the content of the flask was stirred for 3 hours.

To the above reaction solution, 0.16 g of ditertiarybutyl hydroquinone, 0.32 g of U-600 (trade name, manufactured by NITTO KASEI CO., LTD.), 9.6 g of KARENZ AOI (trade name, manufactured by SHOWA DENKO K.K.), and 9.6 g of ethylene glycol diacetate were added, and the reaction solution was allowed to react for 1.5 hours. After the reaction, the reaction solution was subjected to re-precipitation with water and a solid was recovered. 18 g of comparative polymer E (weight average molecular weight: 60,000) were obtained.

The composition for forming a layer to be plated obtained by the above process was applied onto the adhesion-aiding layer of substrate A1 to a thickness of 1 μm by a spin coat method, and was then dried at 80° C. for 30 minutes.

Thereafter, the composition was exposed to light in a patterned manner through a photomask for 300 seconds, using a UV exposing machine (product number: UVX-025161LP01, manufactured by USHIO INC.) at an irradiation power of 23 mW/cm$^2$ (measured by an accumulated UV meter UIT150 with a light-receiving sensor UVD-S254, manufactured by USHIO INC.)

After the exposure, the substrate was immersed in a 1% $Na_2Co_3$ aqueous solution for 5 minutes. However, comparative polymer E at a portion which had not been exposed to light (uncured portion) could not be removed.

All publications, patent applications, and technical standards mentioned in this specification are herein incorporated by reference to the same extent as if each individual publication, patent application, or technical standard was specifically and individually indicated to be incorporated by reference.

What is claimed is:

1. A composition comprising;

a polymer, the polymer having a non-dissociative functional group that interacts with a plating catalyst or a precursor thereof, a radical polymerizable group, and an ionic polar group, wherein the polymer comprises a copolymer that includes a unit represented by the following formula (A), a unit represented by the following formula (B), and a unit represented by the following formula (C):

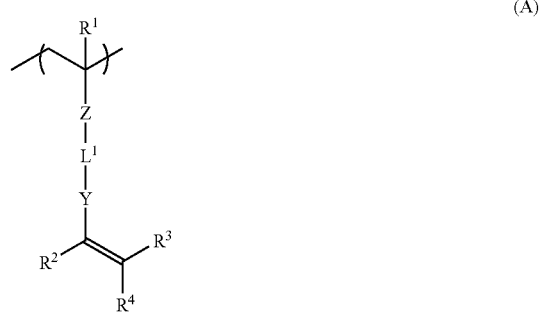

(A)

(B)

-continued (C)

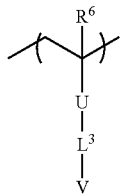

wherein in formulae (A) to (C), each of $R^1$ to $R^6$ independently represents a hydrogen atom or an alkyl group that may be substituted or unsubstituted; each of X, Y, Z and U independently represents a single bond, a divalent organic group that may be substituted or unsubstituted, an ester group, an amide group or an ether group; each of $L^1$, $L^2$ and $L^3$ independently represents a single bond or a divalent organic group that may be substituted or unsubstituted; W represents a non-dissociative functional group that interacts with a plating catalyst or a precursor thereof; and V represents an ionic polar group, and wherein the unit represented by formula (C) is included at an amount of 20 to 70 mol % of the total amount of copolymerization components.

2. The composition according to claim 1, wherein in formula (B), W is a cyano group or an ether group.

3. The composition according to claim 1, wherein in formula (C), V is a carboxyl group.

4. The composition according to claim 1, wherein in formula (C), V is a carboxyl group and $L^3$ includes a four to eight-membered cyclic structure at a portion at which $L^3$ is connected to V.

5. The composition according to claim 1, wherein in formula (C), V is a carboxyl group and $L^3$ has a chain length of 6 to 18 atoms.

6. The composition according to claim 1, wherein in formula (C), V is a carboxyl group, U is a single bond and $L^3$ is a single bond.

7. A method of forming a metal pattern material, the method comprising:
(1) contacting a composition to a substrate and applying energy to cure the composition at a portion to which the energy has been applied, the composition comprising a polymer having a non-dissociative functional group that interacts with a plating catalyst or a precursor thereof, a radical polymerizable group, and an ionic polar group,
wherein the polymer comprises a copolymer including a unit represented by the following formula (A), a unit represented by the following formula (B) and a unit represented by the following formula (C):

(A)

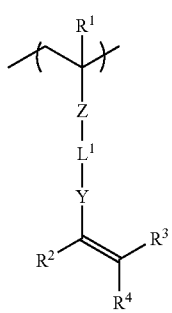

-continued (B)

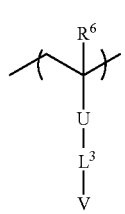

(C)

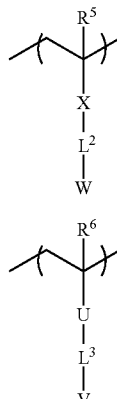

wherein in formulae (A) to (C), each of $R^1$ to $R^6$ independently represents a hydrogen atom or an alkyl group that may be substituted or unsubstituted; each of X, Y, Z and U independently represents a single bond, a divalent organic group that may be substituted or unsubstituted, an ester group, an amide group or an ether group; each of $L^1$, $L^2$ and $L^3$ independently represents a single bond or a divalent organic group that may be substituted or unsubstituted; W represents a non-dissociative functional group that interacts with a plating catalyst or a precursor thereof, and V represents an ionic polar group, and wherein the unit represented by formula (C) is included at an amount of 20 to 70 mol % of the total amount of copolymerization components;

(2) forming a patterned layer by developing an uncured portion of the composition with an aqueous solution;

(3) applying the plating catalyst or the precursor thereof to the patterned layer; and (4) performing plating with respect to the plating catalyst or the precursor thereof.

8. The method according to claim 7, wherein in formula (B), W is a cyano group or an ether group.

9. The method according to claim 7, wherein in formula (C), V is a carboxyl group.

10. The composition according to claim 7, wherein in formula (C), V is a carboxyl group and $L^3$ includes a four to eight-membered cyclic structure at a portion at which $L^3$ is connected to V.

11. The composition according to claim 7, wherein in formula (C), V is a carboxyl group and $L^3$ has a chain length of 6 to 18 atoms.

12. The composition according to claim 7, wherein in formula (C), V is a carboxyl group, U is a single bond and $L^3$ is a single bond.

13. The method according to claim 7, wherein the plating is performed by electroless plating.

14. The method according to claim 13, wherein electroplating is performed after the electroless plating.

15. The method according to claim 7, wherein the substrate includes an intermediate layer and the composition contacts the intermediate layer.

16. The method according to claim 15, wherein the intermediate layer comprises an insulating resin.

17. A metal pattern material formed using the method according to claim 7.

18. A composition comprising a polymer, the polymer having a non-dissociative functional group that interacts with a plating catalyst or a precursor thereof, a radical polymerizable group, and an ionic polar group, wherein the polymer comprises a copolymer including a unit represented by the following formula (A), a unit represented by the following formula (B) and a unit represented by the following formula (C):

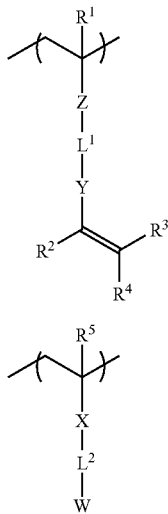

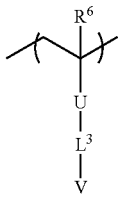

wherein in formulae (A) to (C), each of $R^1$ to $R^6$ independently represents a hydrogen atom or an alkyl group that may be substituted or unsubstituted; each of X, Y, Z and U independently represents a single bond, a divalent organic group that may be substituted or unsubstituted, an ester group, an amide group or an ether group; each of $L^1$, $L^2$ and $L^3$ independently represents a single bond or a divalent organic group that may be substituted or unsubstituted; W represents a non-dissociative functional group that interacts with a plating catalyst or a precursor thereof; and V represents an ionic polar group, and wherein the value of the ionic polarity of the polymer is from 1.5 to 7.0 mmol/g.

* * * * *